(12) United States Patent
Jung et al.

(10) Patent No.: US 8,513,649 B2
(45) Date of Patent: Aug. 20, 2013

(54) VINYL-BASED POLYMER WITH SILICON OR/AND TIN AND ORGANIC LIGHT EMISSION DIODE USING THE SAME

(75) Inventors: Sung Hyun Jung, Gyeonggi-do (KR); Mi Young Chae, Gyeonggi-do (KR); Eun Sun Yu, Gyeonggi-do (KR); Hyung Sun Kim, Gyeonggi-do (KR); Nam Soo Kim, Gyeonggi-do (KR); Young Hoon Kim, Gyeonggi-do (KR); Ho Jae Lee, Seoul (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 347 days.

(21) Appl. No.: 12/451,520

(22) PCT Filed: Dec. 26, 2007

(86) PCT No.: PCT/KR2007/006828
§ 371 (c)(1),
(2), (4) Date: Apr. 19, 2010

(87) PCT Pub. No.: WO2008/143387
PCT Pub. Date: Nov. 27, 2008

(65) Prior Publication Data
US 2010/0237329 A1    Sep. 23, 2010

(30) Foreign Application Priority Data
May 17, 2007 (KR) .................. 10-2007-0048246

(51) Int. Cl.
*H01L 29/08*    (2006.01)

(52) U.S. Cl.
USPC ............................... 257/40; 546/14; 526/279

(58) Field of Classification Search
USPC ............ 257/40; 546/14; 526/279; 556/489, 556/482
See application file for complete search history.

(56) References Cited

U.S. PATENT DOCUMENTS

| 5,731,599 | A * | 3/1998 | Hwang et al. ............... 257/40 |
| 5,807,945 | A * | 9/1998 | Chen et al. ............... 526/279 |
| 5,905,128 | A * | 5/1999 | Chen et al. ............... 526/279 |
| 6,310,231 | B1 * | 10/2001 | Igarashi et al. ............ 556/489 |
| 6,368,732 | B1 * | 4/2002 | Jin et al. ................ 428/690 |
| 6,492,468 | B1 * | 12/2002 | Chen et al. ............... 525/338 |
| 6,885,038 | B2 * | 4/2005 | Huang et al. ............. 257/103 |
| 8,217,130 | B2 * | 7/2012 | Saito et al. ............... 528/32 |
| 2003/0119961 | A1 * | 6/2003 | Oshima et al. ............ 524/431 |

(Continued)

FOREIGN PATENT DOCUMENTS

JP    60-196750 A    10/1985
JP    62-034908 A    2/1987

(Continued)

OTHER PUBLICATIONS

European Search Report issued in corresponding European application, 07 85 1779, dated May 30, 2011.

*Primary Examiner* — Kimberly Rizkallah
*Assistant Examiner* — Caleb Henry
(74) *Attorney, Agent, or Firm* — Lee & Morse, P.C.

(57) ABSTRACT

Disclosed herein is a vinyl-based polymer with silicon and/or tin for an organic layer of an OLED. The polymer is soluble in an organic solvent and can emit fluorescent and phosphorescent light from red to blue wavelengths so as to be used for a host material of an organic light emitting layer in the OLED.

18 Claims, 4 Drawing Sheets

(56) References Cited

U.S. PATENT DOCUMENTS

| | | | |
|---|---|---|---|
| 2004/0048100 A1* | 3/2004 | Ebisawa et al. | 428/690 |
| 2005/0238919 A1 | 10/2005 | Ogasawara | |
| 2006/0177691 A1* | 8/2006 | Tai et al. | 428/690 |
| 2007/0173657 A1* | 7/2007 | Chen et al. | 556/413 |
| 2007/0176147 A1* | 8/2007 | Buesing et al. | 252/301.16 |

FOREIGN PATENT DOCUMENTS

| | | |
|---|---|---|
| KR | 10 1997-0021108 A | 5/1997 |
| KR | 10-2000-0032068 A | 6/2000 |
| KR | 10 2001-0018900 A | 3/2001 |

* cited by examiner

VINYL-BASED POLYMER WITH SILICON OR/AND TIN AND ORGANIC LIGHT EMISSION DIODE USING THE SAME

TECHNICAL FIELD

The present invention relates to a vinyl-based polymer comprising silicon and/or tin, and more particularly to a vinyl-based polymer comprising silicon and tin used to form a light emitting layer of an organic light emitting diode.

BACKGROUND ART

An Organic Light Emitting Diode (OLED) has various advantages over a Thin Film Transistor-Liquid Crystal Display (TFT-LCD), such as lower voltage requirement for driving, slim shape, wide viewing angle, faster response time, etc. Furthermore, the OLED provides equivalent or superior image quality, especially in small and medium sizes, to the TFT-LCD and is produced via a simple manufacturing process which leads to a competitive price as compared to other types of display devices. With such advantages, it has been spotlighted as a next step in display technology.

The OLED includes a lower substrate where an Indium Tin Oxide (ITO) transparent electrode pattern is formed as an anode on a transparent glass substrate, an upper substrate where a metal electrode is formed as a cathode on a substrate, and an organic light emitting material disposed between the upper and lower substrates. With this configuration, when voltage is applied between the transparent electrode and the metal electrode, current flows through the organic light emitting material, so that the OLED emits light.

Organic light emitting materials used for OLEDs were first developed in 1987 by the Eastman Kodak Company using small molecules such as aromatic diamines and an aluminum complex as a light emitting layer material (Applied Physics Letters, Vol. 51, p 913, 1987). Also, OLEDs using such materials were first reported as a device with practical performance by C. W. Tang, et al. [Applied Physics Letters, Vol. 51, No. 12, pp 913-915, 1987].

Those documents disclose an organic light emitting layer which has a stacked structure of a diamine derivative thin film (hole transport layer) and an Alq3(tris(8-hydroxy-quinolate) aluminum) thin film (electron transportable light emitting layer).

The foregoing materials for the light emitting layer are all polymers which are soluble in common solvents, unlike low molecular weight light emitting materials, and can form a light emitting layer by coating methods.

Recently, a variety of polymeric light emitting materials have been proposed (e.g. Advanced Materials, Vol. 12, pp 1737-1750, 2000).

In the case of manufacturing a device using the polymeric light emitting material by coating, the polymeric light emitting material provides merits in that manufacturing processes can be simplified and in that large scale devices can be easily made, unlike when low molecular vacuum deposition is employed.

When an electric field is applied to an OLED such that holes and electrons are injected from an anode and a cathode, the holes and electrons are recombined into excitons in a light emitting layer.

Then, the excitons emit light when returning to the ground state.

Light emission mechanisms can be divided into two categories: fluorescence using singlet excitons and phosphorescence using triplet excitons.

Recently, reports have been made that a phosphorescent material as well as a fluorescent material can be used as a light emitting material for an OLED (by D. F. O'Brien et al., Applied Physics Letters, 74 (3), pp 442-444, 1999; M. A. Baldo et al., Applied Physics Letters, 75 (1), pp 4-6, 1999). Phosphorescence is based on the following mechanism: after transition of electrons from the ground state to the excited state, non-emissive transition of singlet excitons to triplet excitons occurs through intersystem crossing, and then, transition of triplet excitons to the ground state occurs while emitting light.

Here, since the triplet excitons are spin-forbidden directly to the ground state in transition, they undergo transition to the ground state after flipping of electron spins. Thus, phosphorescence has a longer lifetime (emission time) than fluorescence.

That is, fluorescence has an emission duration of just several nano seconds, whereas phosphorescence has a relatively long duration of several micro seconds.

In view of quantum mechanics, when holes from the anode and electrons from the cathode are recombined into the excitons in an OLED, the generation ratio of singlet to triplet is 1:3, which means three times as many triplet excitons are generated as singlet electrons.

Hence, in fluorescence, 25% of the excitons are in an excited singlet state (75% in a triplet state), thereby limiting the emission efficiency. In phosphorescence, however, 75% of the excitons in the triplet state can be used along with 25% of the excitons in the excited singlet state, which enables 100% internal quantum efficiency to be obtained in theory.

Thus, a phosphorescent material can provide about three times higher emission efficiency than a fluorescent material in practical use.

For the OLED having the structure described above, a luminescent pigment (dopant) can be added to the light emitting layer (host) to improve efficiency and stability of light emission.

In this case, the efficiency and performance of the light emitting device can vary depending on what type of host is used for the light emitting layer. As proposed from studies on the light emitting layer (host), examples of an monomolecular organic host material include naphthalene, anthracene, phenanthrene, tetracene, pyrene, benzopyrene, chrysene, picene, carbazole, fluorine, biphenyl, terphenyl, triphenylene oxide, dihalobiphenyl, trans-stilbene, and 1,4-diphenylbutadiene.

A polymer host can also make an idential function through synthesis of polymers comprising the molecules as proposed above as examples.

Although advances have been achieved in the field of OLED technology, there is a need of further improvements in emission efficiency, color purity, and electrical stability.

Moreover, the current advances in technology are insufficient to realize a large-scale light emitting device.

Thus, there is still a need of a polymeric light emitting material that can solve the problems of the conventional materials as described above.

DISCLOSURE

Technical Problem

Therefore, the present invention is conceived in view of the above problems of the conventional technique, and it is an aspect of the present invention to provide a vinyl-based polymer comprising silicon and/or tin for an organic layer of an OLED, which is soluble in an organic solvent and can emit fluorescent and phosphorescent light from red to blue wavelengths so as to be used for a host material of an organic light emitting layer in the OLED.

Technical Solution

In accordance with an aspect of the present invention, the above and other objects can be accomplished by the provision of a vinyl-based polymer comprising silicon and/or tin for an organic layer of an OLED, which includes a repeat unit represented by the following General Formula 2 and formed by polymerization of a monomer represented by the following General Formula 1.

In accordance with another aspect of the present invention, a vinyl-based polymer comprising silicon and/or tin for an organic layer of an OLED includes a repeat unit represented by the following General Formula 2 and formed by polymerization of a monomer represented by the following General Formula 1, and a repeat unit represented by the following General Formula 4 and formed by polymerization of a monomer represented by the following General Formula 3.

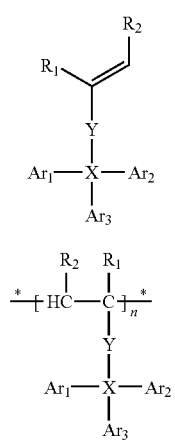

[General Formula 1]

[General Formula 2]

(in General Formulas 1 and 2, X represents silicon (Si) or tin (Sn); $Ar_1$, $Ar_2$, and $Ar_3$ may be the same or different and each represents a C1-C30 substituted or non-substituted alkyl group, a C1-C30 substituted or non-substituted acyl group, a C1-C30 substituted or non-substituted alkoxycarbonyl group, a C1-C30 substituted or non-substituted alkoxy group, a C2-C30 substituted or non-substituted alkenyl group, a C2-C30 substituted or non-substituted alkynyl group, a C2-C30 substituted or non-substituted alkylcarboxyl group, a C6-C30 substituted or non-substituted aryl group, a C6-C30 substituted or non-substituted aralkyl group, a C6-C30 substituted or non-substituted aralkyloxy group, a C2-C30 substituted or non-substituted heteroaryl group, a C2-C30 substituted or non-substituted heteroaryloxy group, a C6-C30 substituted or non-substituted aryloxy group, and a C4-C30 substituted or non-substituted cycloalkyl group; Y is single-bonded and represents an alkylene group (preferably C1-C20, more preferably C1-C12, and even more preferably C1-C8, e.g., methylene, ethylene, propylene, and the like), an arylene group (preferably C6-C30, more preferably C6-C20, and even more preferably C6-C12, e.g., phenylene, biphenylene, naphthalene, and the like), an oxyalkylene group (preferably C1-C20, more preferably C1-C12, and even more preferably C1-C8, e.g., oxymethylene, oxyethylene, and the like), an oxyarylene group (preferably C6-C20, more preferably C6-C16, and even more preferably C6-C12, e.g., oxyphenylene, oxybiphenylene, oxynaphthalene, and the like), an oxycarbonyl group, an amide group, a urethane group, and the like, and such divalent organic groups may also be displaced by the foregoing substituted groups; and $R_1$ and $R_2$ may be the same or different and each represents a hydrogen atom or a univalent substitution group, namely an alkyl group (preferably C1-C20), an alkenyl group (preferably C2-C20), an aryl group (preferably C6-C30), an alkoxy group (preferably C1-C20), an aryloxy group (preferably C6-C20), a hetero-oxy group (preferably C2-C20), a silyloxy group (preferably C3-C40), an acyl group (preferably C1-C20), an alkoxycarbonyl group (preferably C2-C20), an acyloxy group (preferably C2-C20), an acylamino group (preferably C2-C20), an alkoxycarbonylamino group (preferably C2-C20), an anyloxycarbonylamino group (preferably C7-C20), a sulfamoylamino group (preferably C1-C20), a sulfonyl group (preferably C0-C20), an alkylthio group (preferably C1-C20), an arylthio group (preferably C6-C20), a heterocyclic thiol group (preferably C1-C20), a sulfonyl group (preferably C1-C20), an ureide group (preferably C1-C20), a phosphoamide group (preferably C1-C20), a hydroxyl group, a halogen, a cyano group, a sulfone group, a carboxyl group, a nitro group, a heteroatom, a silyl group (preferably C3-C40), or the like.)

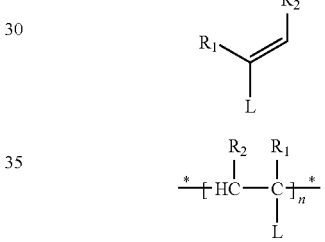

[General Formula 3]

[General Formula 4]

(in General Formulas 3 and 4, L represents carbazole, triphenylamine, phenyl, naphthyl, anthracenyl, pyridyl, or the like which can be substituted by a group selected from the group consisting of a cyano group (—CN), a hydroxyl group (—OH), a C1-C30 alkoxycarbonyl group displaceable by a C1-C6 alkoxycarbonyl group, a C1-C30 (di-)alkylaminocarbonyl group, a C1-C30 alkylcarbonyl group, a halogen, a hydroxyl group, a silyl group, a C1-C30 alkyl group, a C6-C18 aryl group, a C1-C30 alkoxy group, a C1-C30 alkoxycarbonyl group, a C1-C30 acyloxy group, and a C1-C30 alkylcarbonyl group; and $R_1$ and $R_2$ may be the same or different and each represents a hydrogen atom or a univalent substitution group, namely an alkyl group (preferably C1-C20), an alkenyl group (preferably C2-C20), an aryl group (preferably C6-C30), an alkoxy group (preferably C1-C20), an aryloxy group (preferably C6-C20), a hetero-oxy group (preferably C2-C20), a silyloxy group (preferably C3-C40), an acyl group (preferably C1-C20), an alkoxycarbonyl group (preferably C2-C20), an acyloxy group (preferably C2-C20), an acylamino group (preferably C2-C20), an alkoxycarbonylamino group (preferably C2-C20), an anyloxycarbonylamino group (preferably C7-C20), a sulfamoylamino group (preferably C1-C20), a sulfonyl group (preferably C0-C20), an alkylthio group (preferably C1-C20), an arylthio group (preferably C6-C20), a heterocyclic thiol group (preferably C1-C20), a sulfonyl group (preferably C1-C20), an ureide group (preferably C1-C20), a phosphoamide group (preferably C1-C20), a hydroxyl group, a halogen, a cyano group, a sulfone group, a carboxyl group, a nitro group, a heteroatom, a silyl group (preferably C3-C40), or the like.)

Advantageous Effects

According to the exemplary embodiments of the present invention, since a vinyl-based polymer comprising silicon and/or tin is soluble in an organic solvent and can emit fluorescent and phosphorescent light from red to blue wavelengths, the polymer can be used for a host material of an organic light emitting layer in an OLED.

DESCRIPTION OF DRAWINGS

The above and other objects, features and other advantages of the present invention will be more clearly understood from the following detailed description taken in conjunction with the accompanying drawings, in which.

BEST MODE

Figure 1:
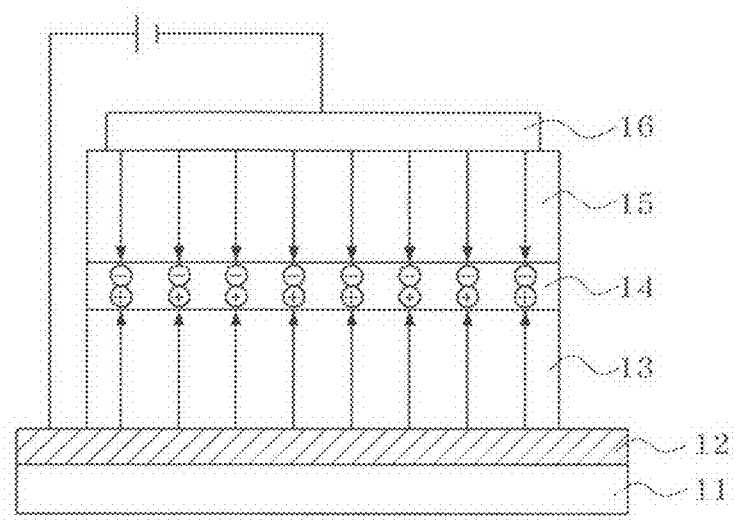
FIG. 1 is a cross-sectional view of a conventional OLED including a substrate, anode, hole transport layer, light emitting layer, electron transport layer, and cathode.
Figure 2:
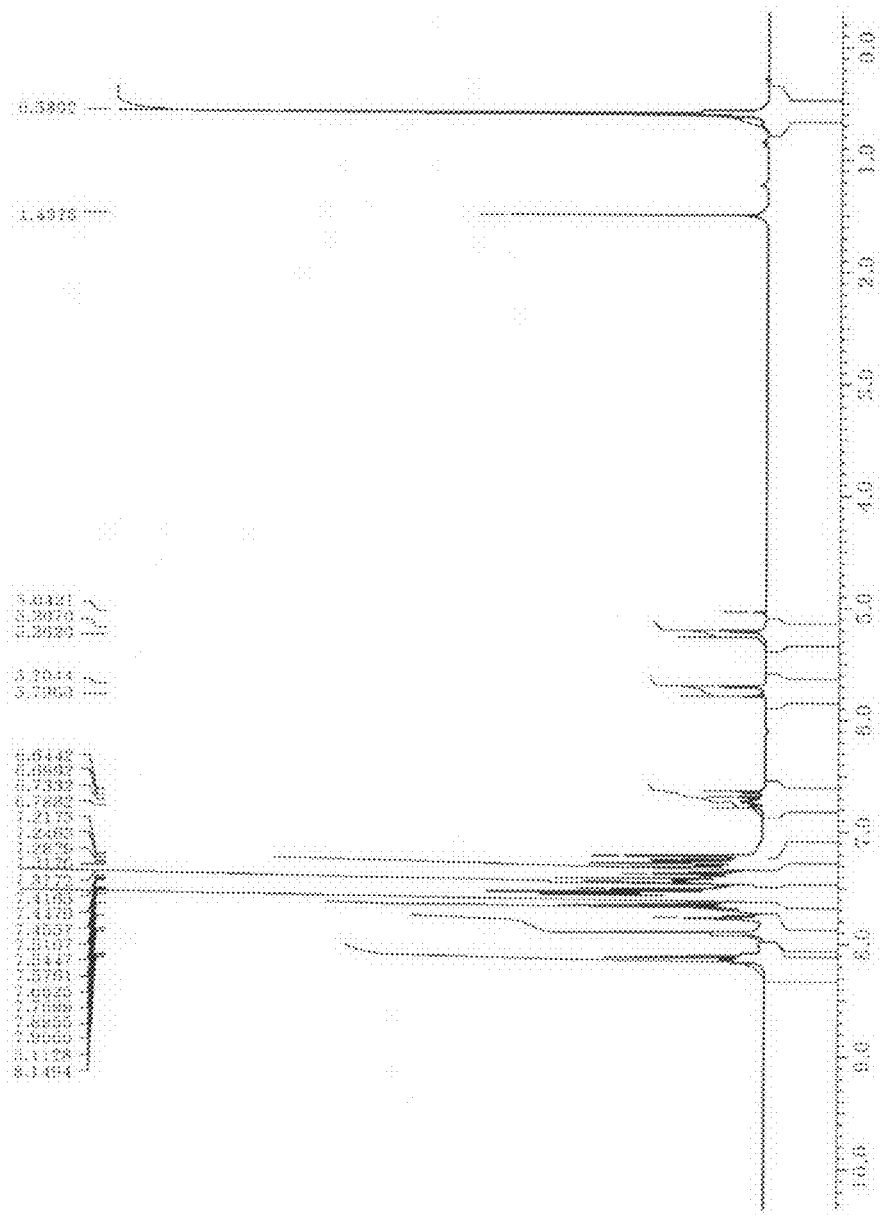
FIG. 2 is a 1H-NMR spectrum of Monomer M-5 in Example 9.
Figure 3:
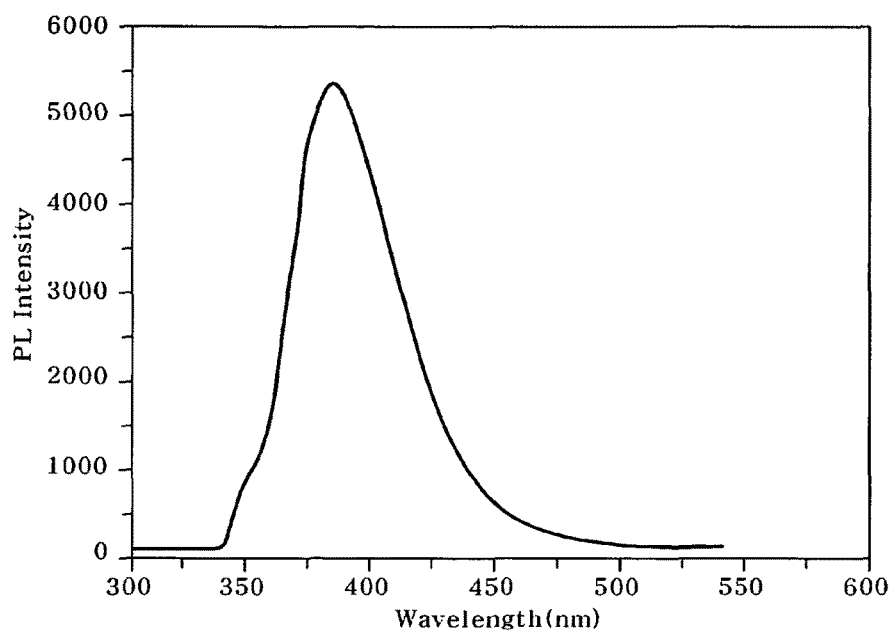
FIG. 3 is a PL spectrum of Polymer P-4 in Example 14.
Figure 4:
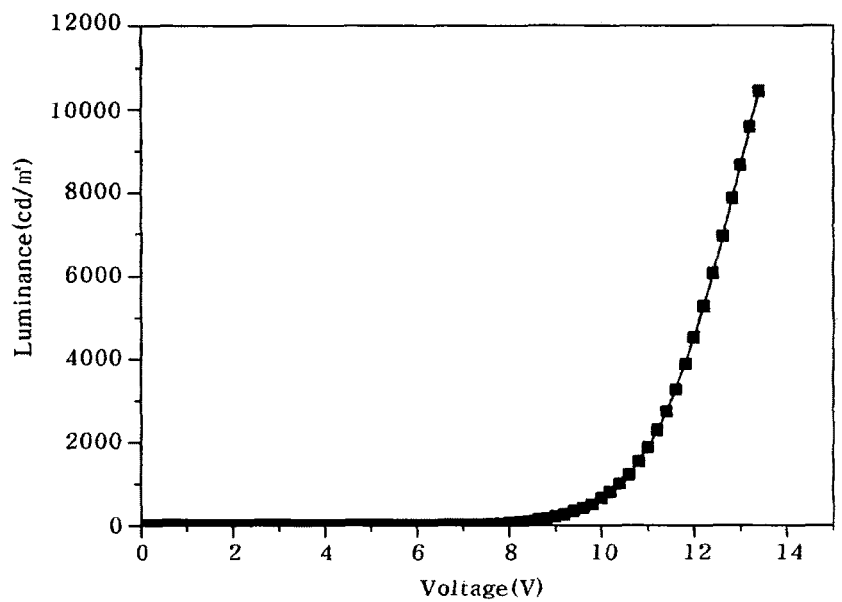
FIG. 4 is a graph depicting the relationship between luminance and voltage in a device having the structure Al (1000 Å)/LiF (10 Å)/Alq3 (200 Å)/Balq (50 Å)/EML (P-4+Ir(ppy)3)/PEDOT/ITO (1500 Å)
Figure 5:
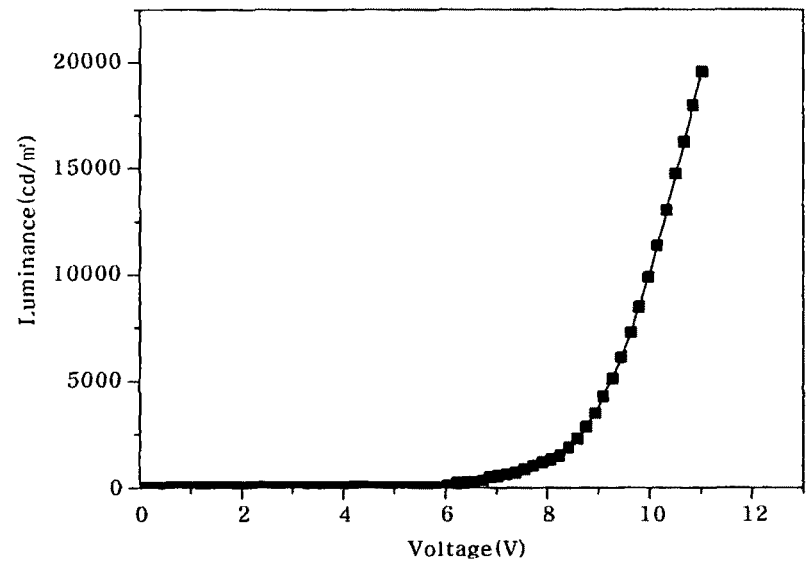
FIG. 5 is a graph depicting the relationship between luminance and voltage in a device having the structure Al (1000 Å)/LiF (10 Å)/Alq3 (200 Å)/Balq (50 Å)/EML (P-4+CBP+Ir(ppy)3)/PEDOT/ITO (1500 Å).

According to a first embodiment of the present invention, a vinyl-based polymer comprising silicon and/or tin for an organic layer of an OLED comprises a repeat unit represented by the following General Formula 2 and formed by polymerization of a monomer represented by the following General Formula 1.

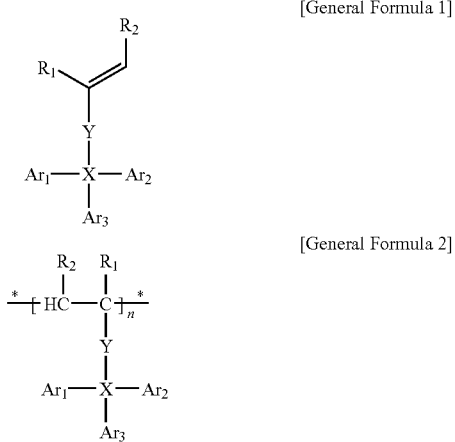

[General Formula 1]

[General Formula 2]

(in General Formulas 1 and 2, X represents silicon (Si) or tin (Sn); $Ar_1$, $Ar_2$, and $Ar_3$ may be the same or different and each represents a C1-C30 substituted or non-substituted alkyl group, a C1-C30 substituted or non-substituted acyl group, a C1-C30 substituted or non-substituted alkoxycarbonyl group, a C1-C30 substituted or non-substituted alkoxy group, a C2-C30 substituted or non-substituted alkenyl group, a C2-C30 substituted or non-substituted alkynyl group, a C2-C30 substituted or non-substituted alkylcarboxyl group, a C6-C30 substituted or non-substituted aryl group, a C6-C30 substituted or non-substituted aralkyl group, a C6-C30 substituted or non-substituted aralkyloxy group, a C2-C30 substituted or non-substituted heteroaryl group, a C2-C30 substituted or non-substituted heteroaryloxy group, a C6-C30 substituted or non-substituted aryloxy group, and a C4-C30 substituted or non-substituted cycloalkyl group; Y is single-bonded and represents an alkylene group (preferably C1-C20, more preferably C1-C12, and even more preferably C1-C8, e.g., methylene, ethylene, propylene, and the like), an arylene group (preferably C6-C30, more preferably C6-C20, and even more preferably C6-C12, e.g., phenylene, biphenylene, naphthalene, and the like), an oxyalkylene group (preferably C1-C20, more preferably C1-C12, and even more preferably C1-C8, e.g., oxymethylene, oxyethylene, and the like), an oxyarylene group (preferably C6-C20, more preferably C6-C16, and even more preferably C6-C12, e.g., oxyphenylene, oxybiphenylene, oxynaphthalene, and the like), an oxycarbonyl group, an amide group, a urethane group, or the like, and such divalent organic groups may also be displaced by the foregoing substituted groups; and $R_1$ and $R_2$ may be the same or different and each represents a hydrogen atom or a univalent substitution group, namely an alkyl group (preferably C1-C20), an alkenyl group (preferably C2-C20), an aryl group (preferably C6-C30), an alkoxy group (preferably C1-C20), an aryloxy group (preferably C6-C20), a heterooxy group (preferably C2-C20), a silyloxy group (preferably C3-C40), an acyl group (preferably C1-C20), an alkoxycarbonyl group (preferably C2-C20), an acyloxy group (preferably C2-C20), an acylamino group (preferably C2-C20), an alkoxycarbonylamino group (preferably C2-C20), an anyloxycarbonylamino group (preferably C7-C20), a sulfamoylamino group (preferably C1-C20), a sulfonyl group (preferably C0-C20), an alkylthio group (preferably C1-C20), an arylthio group (preferably C6-C20), a heterocyclic thiol group (preferably C1-C20), a sulfonyl group (preferably C1-C20), an ureide group (preferably C1-C20), a phosphoamide group (preferably C1-C20), a hydroxyl group, a halogen, a cyano group, a sulfone group, a carboxyl group, a nitro group, a heteroatom, a silyl group (preferably C3-C40), or the like.)

MODE FOR INVENTION

According to a first embodiment of the present invention, a vinyl-based polymer comprising silicon and/or tin for an organic layer of an OLED comprises a repeat unit represented by the following General Formula 2 and formed by polymerization of a monomer represented by the following General Formula 1.

According to a second embodiment of the present invention, a vinyl-based polymer comprising silicon and/or tin for an organic layer of an OLED comprises a repeat unit represented by the following General Formula 2 and formed by polymerization of a monomer represented by the following General Formula 1, and a repeat unit represented by the following General Formula 4 and formed by polymerization of a monomer represented by the following General Formula 3.

[General Formula 1]

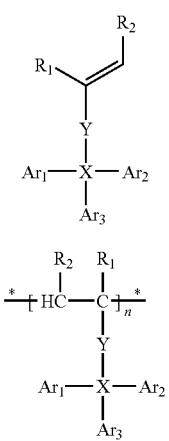

[General Formula 2]

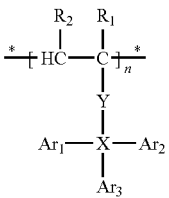

(in General Formulas 1 and 2, X represents silicon (Si) or tin (Sn); $Ar_1$, $Ar_2$, and $Ar_3$ may be the same or different and each represents a C1-C30 substituted or non-substituted alkyl group, a C1-C30 substituted or non-substituted acyl group, a C1-C30 substituted or non-substituted alkoxycarbonyl group, a C1-C30 substituted or non-substituted alkoxy group, a C2-C30 substituted or non-substituted alkenyl group, a C2-C30 substituted or non-substituted alkynyl group, a C2-C30 substituted or non-substituted alkylcarboxyl group, a C6-C30 substituted or non-substituted aryl group, a C6-C30 substituted or non-substituted aralkyl group, a C6-C30 substituted or non-substituted aralkyloxy group, a C2-C30 substituted or non-substituted heteroaryl group, a C2-C30 substituted or non-substituted heteroaryloxy group, a C6-C30 substituted or non-substituted aryloxy group, and a C4-C30 substituted or non-substituted cycloalkyl group; Y is single-bonded and represents an alkylene group (preferably C1-C20, more preferably C1-C12, and even more preferably C1-C8, e.g., methylene, ethylene, propylene, and the like), an arylene group (preferably C6-C30, more preferably C6-C20, and even more preferably C6-C12, e.g., phenylene, biphenylene, naphthalene, and the like), an oxyalkylene group (preferably C1-C20, more preferably C1-C12, and even more preferably C1-C8, e.g., oxymethylene, oxyethylene, and the like), an oxyarylene group (preferably C6-C20, more preferably C6-C16, and even more preferably C6-C12, e.g., oxyphenylene, oxybiphenylene, oxynaphthalene, and the like), an oxycarbonyl group, an amide group, a urethane group, and the like, and such divalent organic groups may also be displaced by the foregoing substituted groups; and $R_1$ and $R_2$ may be the same or different and each represents a hydrogen atom or a univalent substitution group, namely an alkyl group (preferably C1-C20), an alkenyl group (preferably C2-C20), an aryl group (preferably C6-C30), an alkoxy group (preferably C1-C20), an aryloxy group (preferably C6-C20), a hetero-oxy group (preferably C2-C20), a silyloxy group (preferably C3-C40), an acyl group (preferably C1-C20), an alkoxycarbonyl group (preferably C2-C20), an acyloxy group (preferably C2-C20), an acylamino group (preferably C2-C20), an alkoxycarbonylamino group (preferably C2-C20), an anyloxycarbonylamino group (preferably C7-C20), a sulfamoylamino group (preferably C1-C20), a sulfonyl group (preferably C0-C20), an alkylthio group (preferably C1-C20), an arylthio group (preferably C6-C20), a heterocyclic thiol group (preferably C1-C20), a sulfonyl group (preferably C1-C20), an ureide group (preferably C1-C20), a phosphoamide group (preferably C1-C20), a hydroxyl group, a halogen, a cyano group, a sulfone group, a carboxyl group, a nitro group, a heteroatom, a silyl group (preferably C3-C40), or the like.)

[General Formula 3]

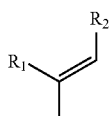

[General Formula 4]

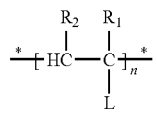

(in General Formulas 3 and 4, L represents carbazole, triphenylamine, phenyl, naphthyl, anthracenyl, pyridyl, or the like which can be substituted by a group selected from the group consisting of a cyano group (—CN), a hydroxyl group (—OH), a C1-C30 alkoxycarbonyl group displaceable by a C1-C6 alkoxycarbonyl group, a C1-C30 (di-)alkylaminocarbonyl group, a C1-C30 alkylcarbonyl group, a halogen, a hydroxyl group, a silyl group, a C1-C30 alkyl group, a C6-C18 aryl group, a C1-C30 alkoxy group, a C1-C30 alkoxycarbonyl group, a C1-C30 acyloxy group, and a C1-C30 alkylcarbonyl group; and $R_1$ and $R_2$ may be the same or different and each represents a hydrogen atom or a univalent substitution group, namely an alkyl group (preferably C1-C20), an alkenyl group (preferably C2-C20), an aryl group (preferably C6-C30), an alkoxy group (preferably C1-C20), an aryloxy group (preferably C6-C20), a hetero-oxy group (preferably C2-C20), a silyloxy group (preferably C3-C40), an acyl group (preferably C1-C20), an alkoxycarbonyl group (preferably C2-C20), an acyloxy group (preferably C2-C20), an acylamino group (preferably C2-C20), an alkoxycarbonylamino group (preferably C2-C20), an anyloxycarbonylamino group (preferably C7-C20), a sulfamoylamino group (preferably C1-C20), a sulfonyl group (preferably C0-C20), an alkylthio group (preferably C1-C20), an arylthio group (preferably C6-C20), a heterocyclic thiol group (preferably C1-C20), a sulfonyl group (preferably C1-C20), an ureide group (preferably C1-C20), a phosphoamide group (preferably C1-C20), a hydroxyl group, a halogen, a cyano group, a sulfone group, a carboxyl group, a nitro group, a heteroatom, a silyl group (preferably C3-C40), or the like.)

As described above, both Reaction Schemes 1 and 2 of the present invention are required to comprise the repeat unit represented by General Formula 2 and formed by polymerizing the monomer represented by General Formula 1.

Here, when the repeat unit represented by General Formula 2 and the repeat unit represented by General Formula 4 are mixed into a copolymer, each of the repeat unit in General Formula 2 and the repeat unit in General Formula 4 is provided in an amount of at least 0.5% by weight or more relative to the entire polymer.

That is, whether in a polymer of the repeat unit represented by General Formula 2 or in a copolymer of the repeat unit represented by General Formula 2 and the repeat unit represented by General Formula 4, a polymer according to the present invention is required to comprise the repeat unit represented by General Formula 2. In particular, in the case of the copolymer of the repeat unit represented by General Formula 2 and the repeat unit represented by General Formula 4, each of the repeat units forms at least 0.5% by weight or more of the entire polymer.

Thus, all polymers comprising at least 0.5 wt % or more of the repeat unit represented by General Formula 2 and the repeat unit represented by General Formula 4 to form the copolymer should be construed to fall within the scope of the appended claims of the present invention.

The monomer represented by General Formula 1 may specifically be represented by the following General Formula 5, more specifically by the following Chemical Formula 1.

[General Formula 5]

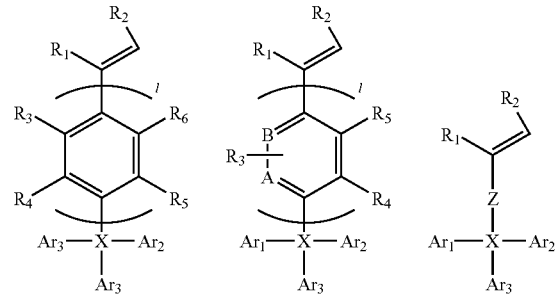

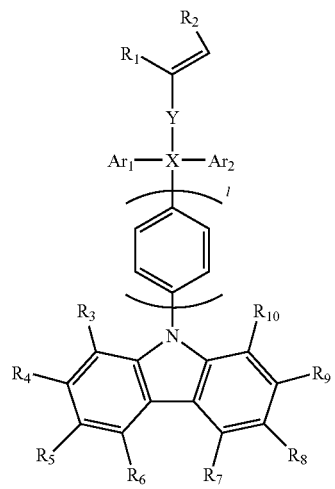

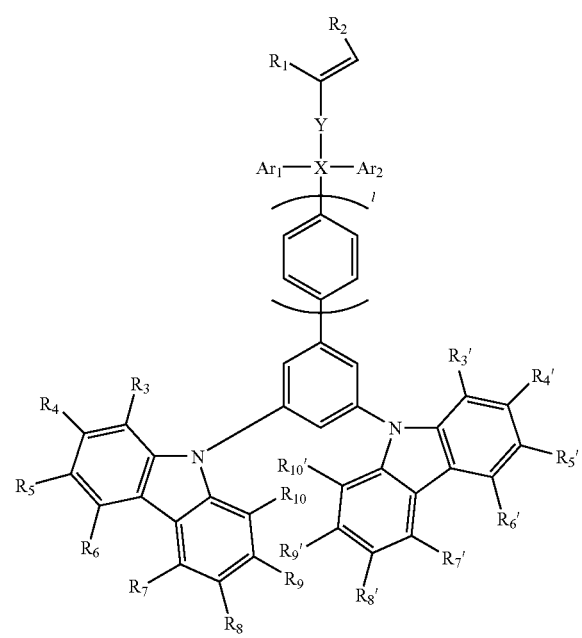

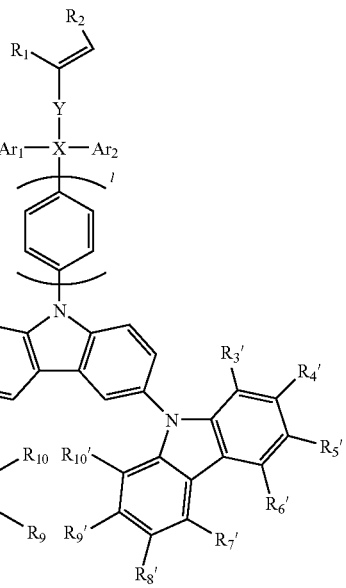

(In General Formula 5, each of X, Y, $Ar_1$, $Ar_2$, $Ar_3$ $R_1$, and $R_2$ represents the same as in General Formula 1; Z is not present or a C1-C30 substituted or non-substituted alkyl group, a C1-C30 substituted or non-substituted acyl group, a C1-C30 substituted or non-substituted alkoxycarbonyl group, a C1-C30 substituted or non-substituted alkoxy group, a C2-C30 substituted or non-substituted alkenyl group, a C2-C30 substituted or non-substituted alkynyl group, a C2-C30 substituted or non-substituted alkylcarboxyl group, and a substituted or non-substituted cycloalkyl group.

At least one of A and B includes a nitrogen atom; and $R_3$-$R_{10}$ and $R_3'$-$R_{10}'$ may be the same or different and each represents a C1-C30 substituted or non-substituted alkyl group, a C1-C30 substituted or non-substituted acyl group, a C1-C30 substituted or non-substituted alkoxycarbonyl group, a C1-C30 substituted or non-substituted alkoxy group, a C2-C30 substituted or non-substituted alkenyl group, a C2-C30 substituted or non-substituted alkynyl group, a C2-C30 substituted or non-substituted alkylcarboxyl group, a C6-C30 substituted or non-substituted aryl group, a C6-C30 substituted or non-substituted aralkyl group, a C6-C30 substituted or non-substituted aralkyloxy group, a C2-C30 substituted or non-substituted heteroaryl group, a C2-C30 substituted or non-substituted heteroaryloxy group, a C6-C30 substituted or non-substituted aryloxy group, a C4-C30 substituted or non-substituted cycloalkyl group, —N(R)(R') (where R and R' independently represent hydrogen, a C1-C30 alkyl group, a C6-C30 aryl group, or a C2-C30 heteroaryl group), a cyano group, a hydroxyl group, and a carboxyl group. Here, two or more neighboring groups of $R_3$-$R_{10}'$ may be connected to form a ring. l is an integer from 0 to 10.)

[Chemical formula 1]
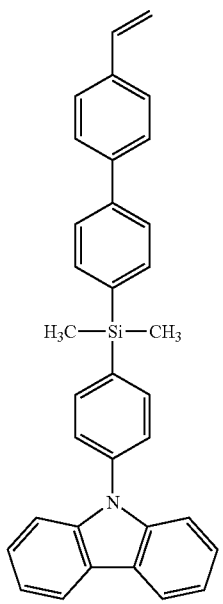
M-1
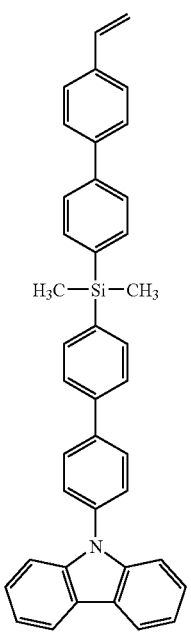
M-2
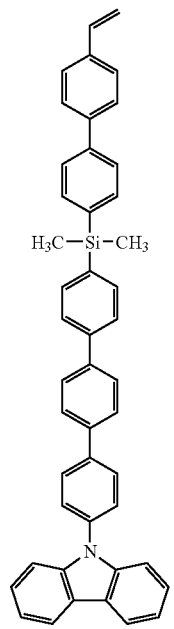
M-3
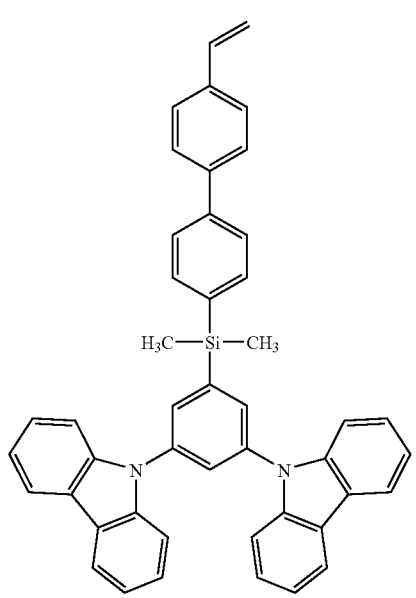
M-4

M-5
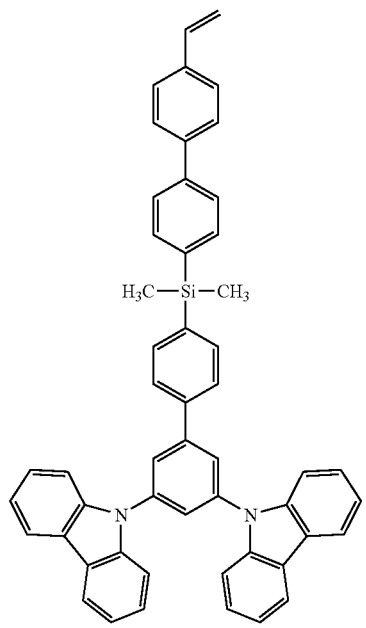
M-6
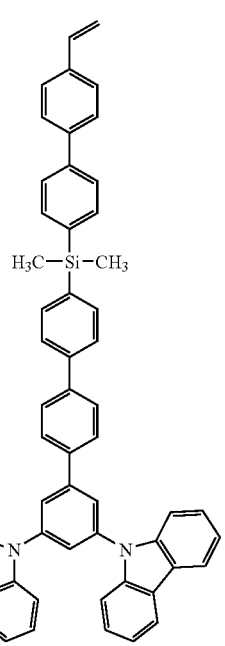
M-7
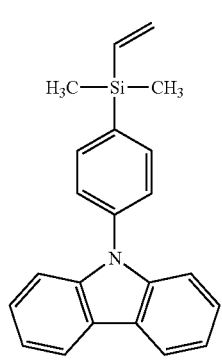
M-8
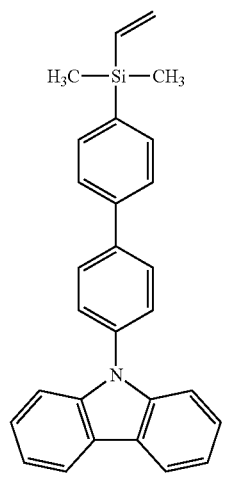
M-9
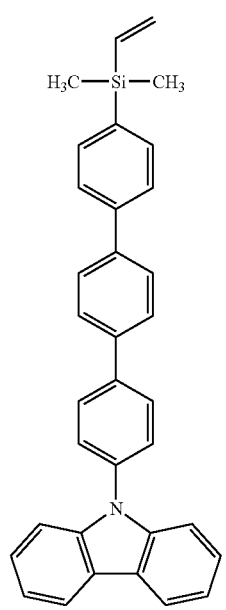
M-10
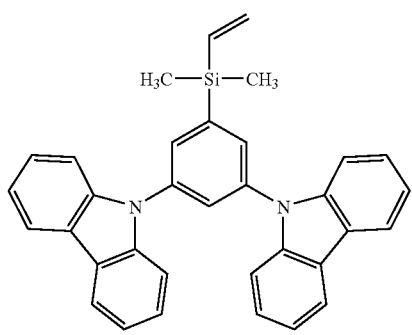

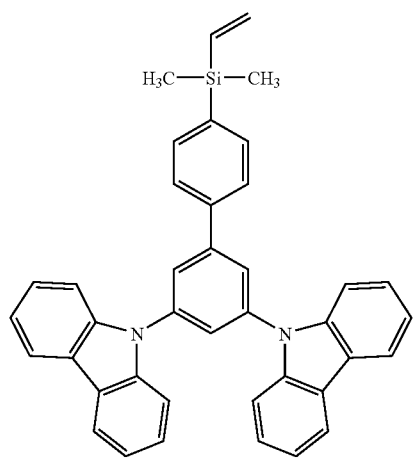
M-11
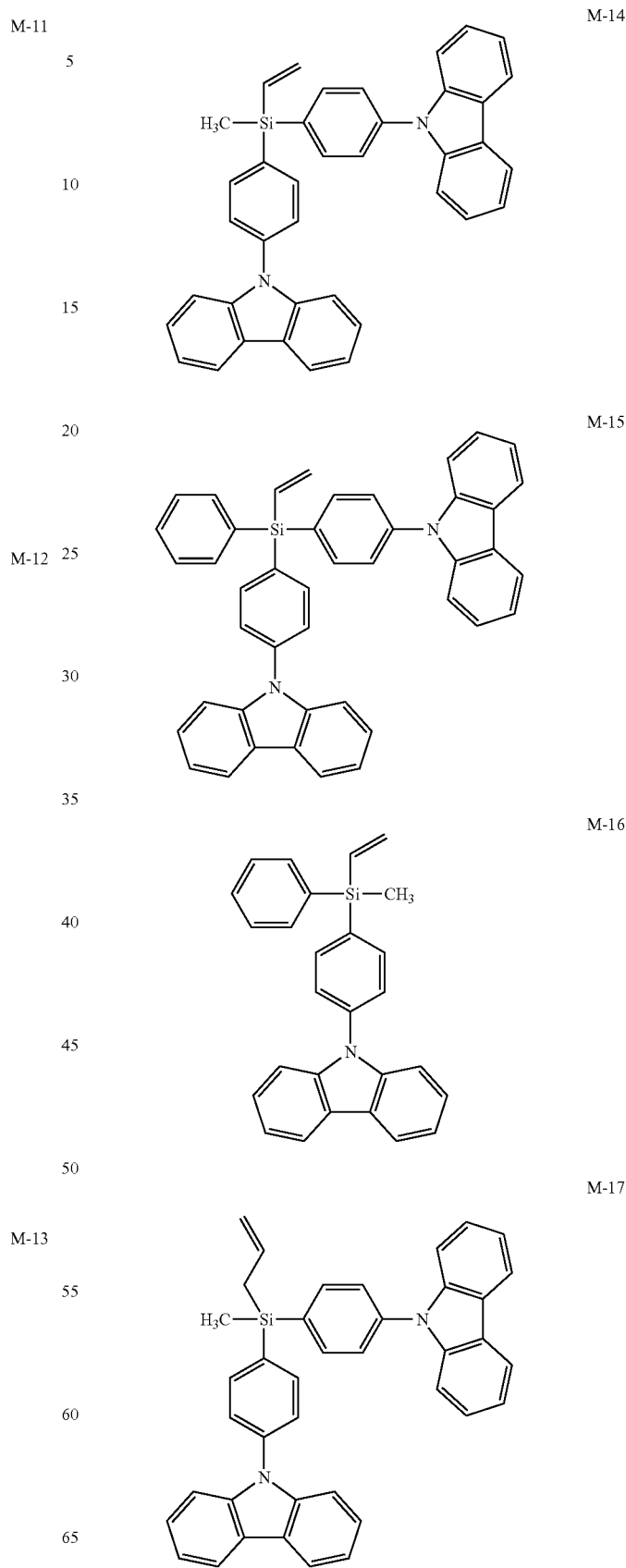
M-14
M-15
M-16
M-17

M-18
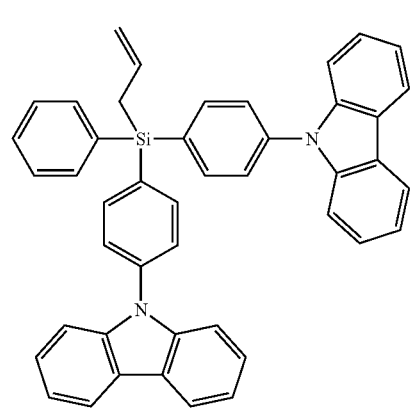
M-19
M-20
M-21
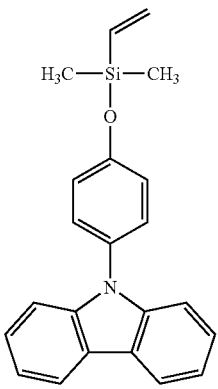
M-22
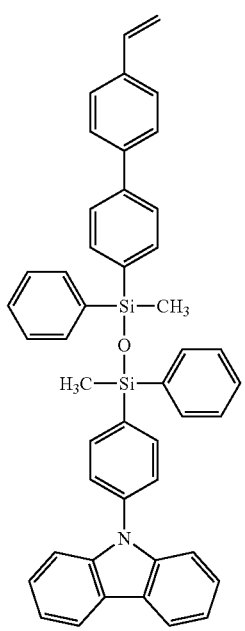
M-23
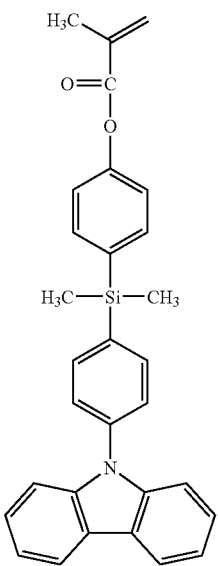

-continued

M-24
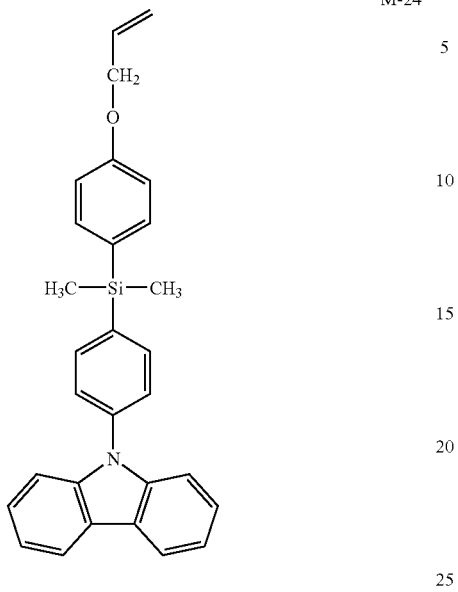

M-25
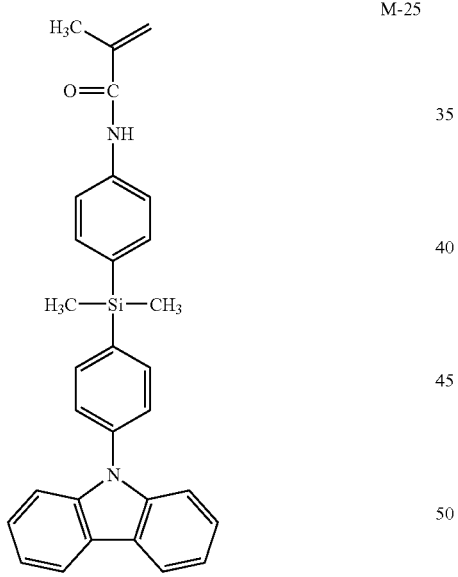

[Chemical Formula 2]

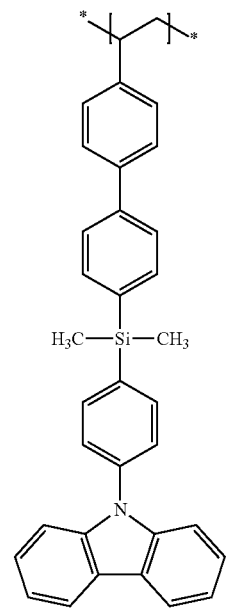
P-1

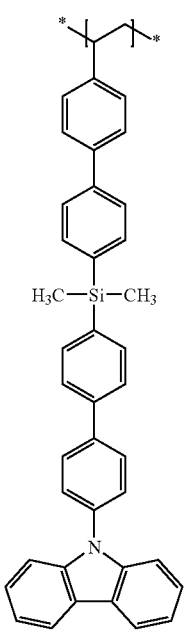
P-2

The repeat unit represented by General Formula 2 obtained by polymerizing the monomer represented by General Formula 1 may be specifically represented by the following Chemical Formula 2, and a repeat unit obtained by polymerization of a monomer represented by General Formula 5 may be specifically represented by the following Chemical Formula 3.

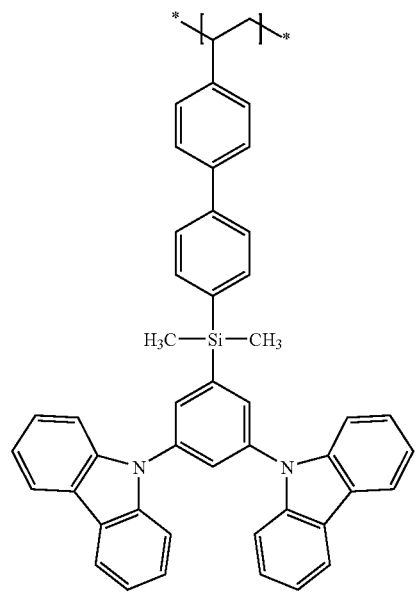
P-3
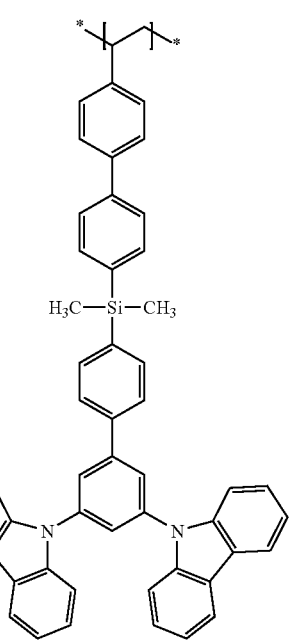
P-4
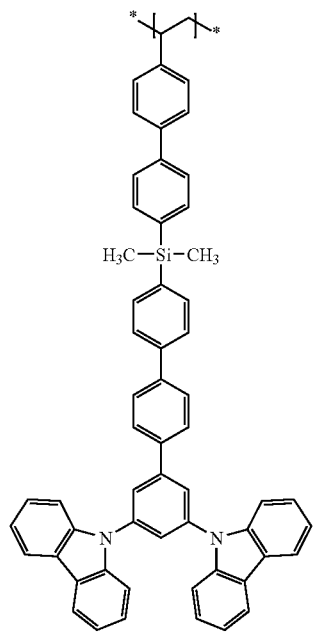
P-5
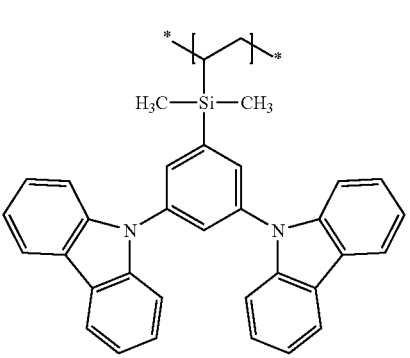
P-6
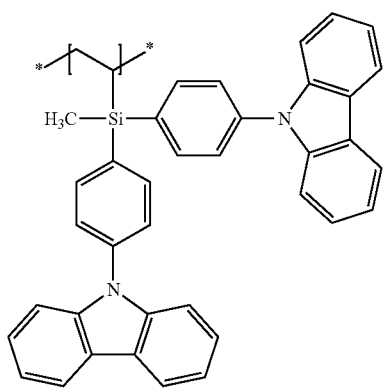
P-7

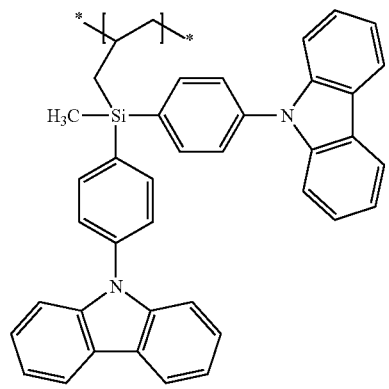
P-8
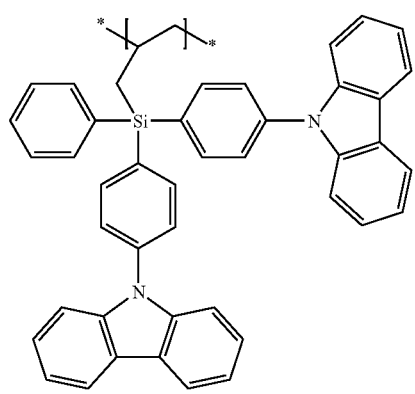
P-9
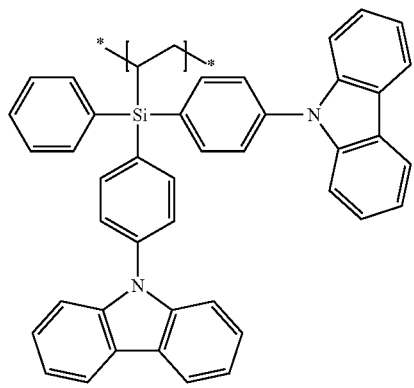
P-10
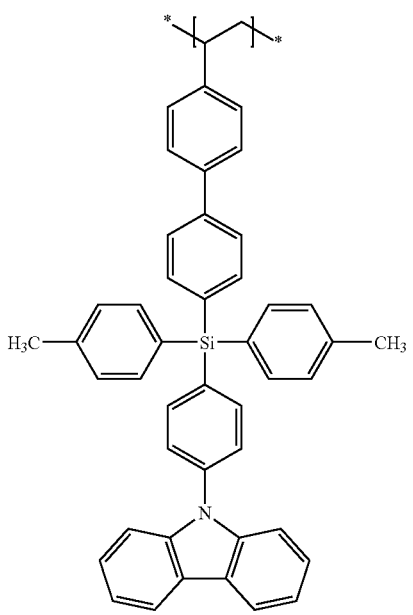
P-11
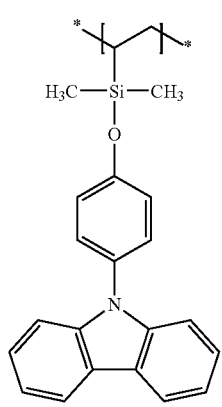
P-12
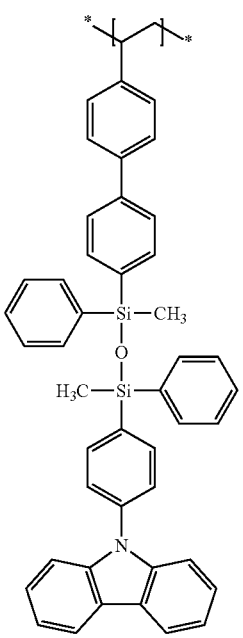
P-13

-continued
P-14
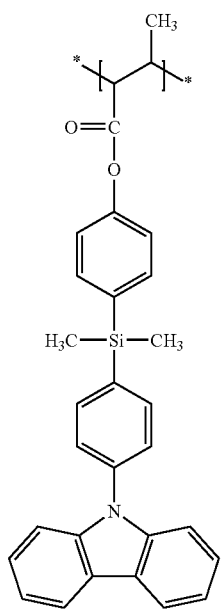
P-15
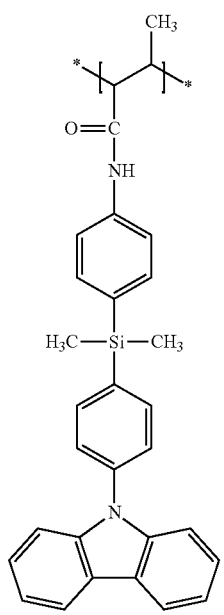
P-16
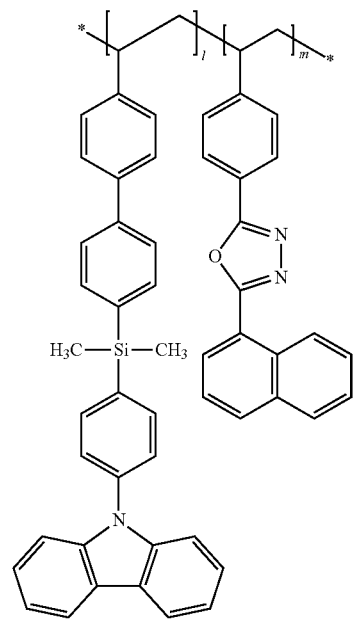
P-17
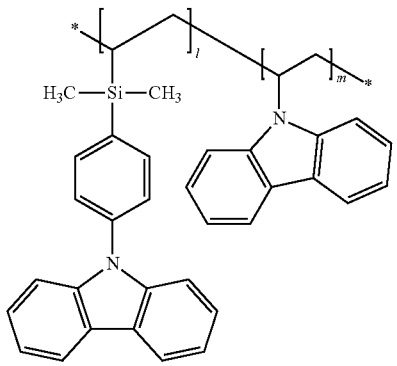
P-18
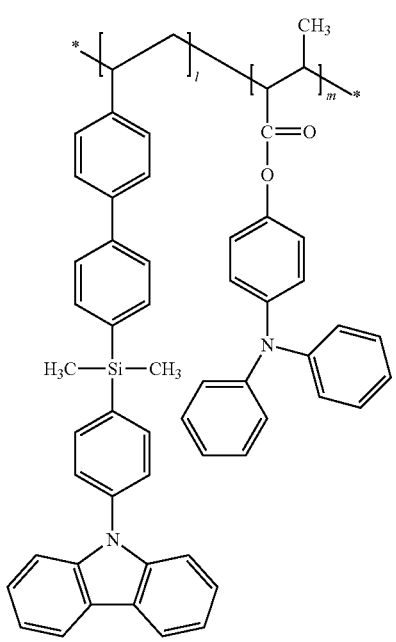

(In Chemical Formula 3, X, Y, Ar$_1$, Ar$_2$, Ar$_3$, R$_1$-R$_{10}$', and l each represent the same groups as in General Formula 5, and n is an integer from 1 to 1,000,000.)

The monomer represented by General Formula 3 may be specifically represented by the following Chemical Formula 4, and the repeat unit represented by General Formula 4 may be specifically represented by the following Chemical Formula 5.

[Chemical Formula 4]

-continued
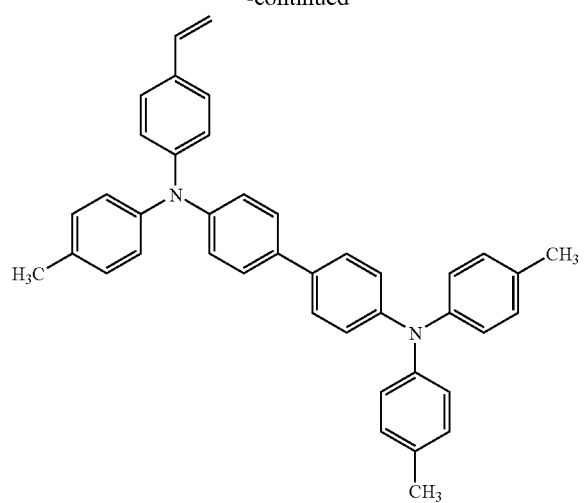
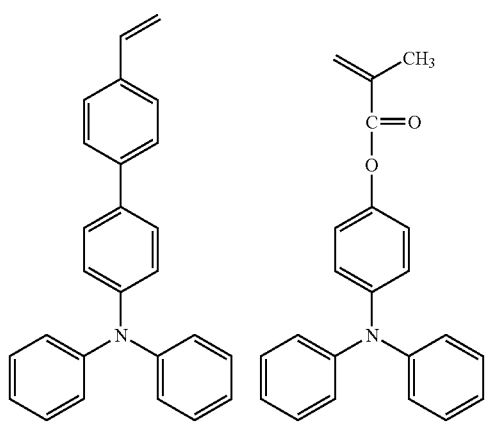
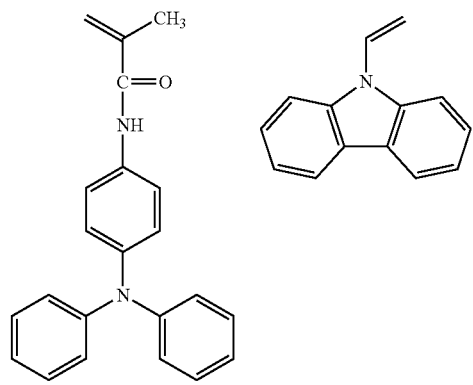
[Chemical Formula 5]
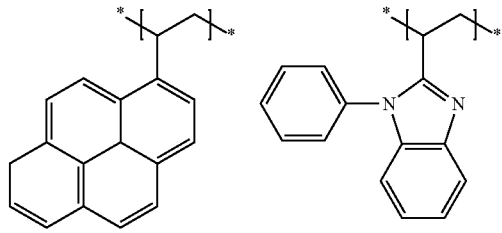
-continued
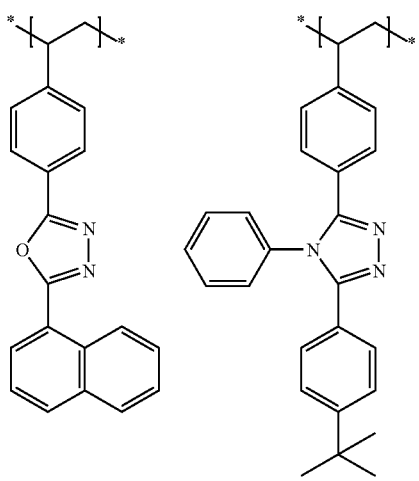
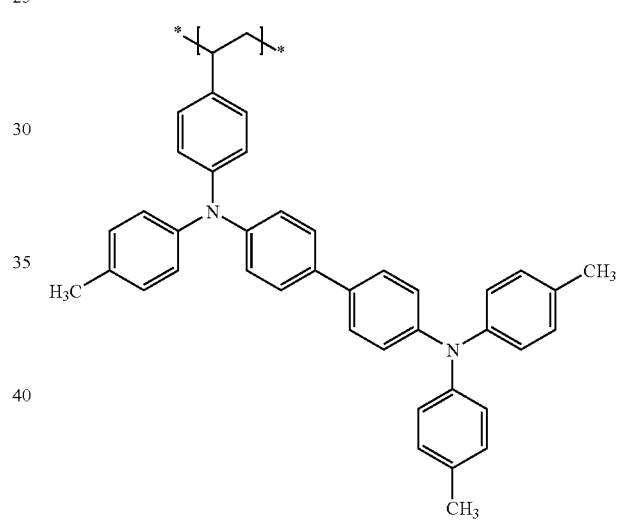
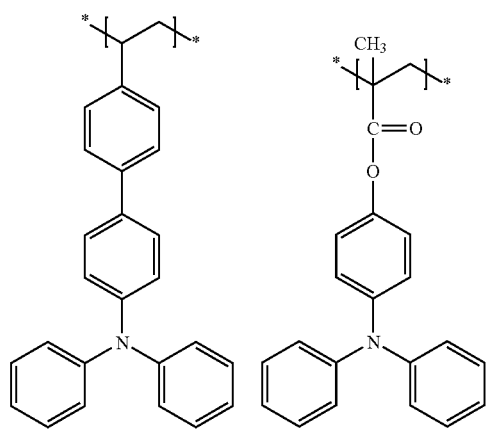

-continued

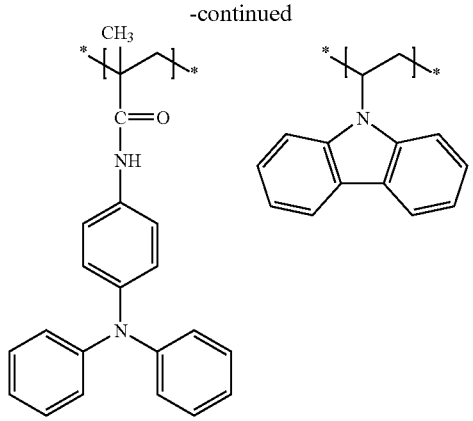

Here, General Formula 5 and Chemical Formula 1 are only illustrative examples of General Formula 1, the repeat unit represented by Chemical Formula 2 is only an illustrative example of General Formula 2, the monomer represented by Chemical Formula 4 is only an illustrative example of General Formula 3, and a repeat unit represented by Chemical Formula 5 is only an illustrative example of an General Formula 4. Chemical Formulas 1 to 5 are only illustrative examples serving to provide a detailed description of General Formulas 1 to 4.

In the present invention, a polymerization method is not limited to a specific one. A general method, such as radical polymerization, cation polymerization, anion polymerization, living cation polymerization, living anion polymerization, coordination polymerization, etc., can be used. Preferably, radical polymerization, cation polymerization, and living cation polymerization are used.

With such methods, a polymer can be obtained by adjusting reaction temperature, reaction solvent, reaction time, reaction initiator, etc.

Although the molecular weight of the polymer according to the present invention can be varied depending on polymerization methods and conditions, the polymer has a weight average molecular weight preferably ranging from 1,000 to 5,000,000, more preferably from 2,000 to 2,000,000, and even more preferably from 3,000 to 1,000,000.

The polymer has a number average molecular weight ranging preferably from 500 to 2,000,000, more preferably from 1,000 to 1,000,000, and even more preferably from 2,000 to 500,000.

The weight average molecular weight over the number average molecular weight is preferably from 1 to 20, more preferably from 1 to 15, and even more preferably from 1 to 10.

Although regularity of a substituent group of the polymer according to the present invention with respect to direction, i.e., tacticity, varies depending on polymerization methods and conditions, the regularity may be syndiotactic, isotactic, a combination of syndiotactic and isotactic, atactic, and the like.

Further, a terminal of the polymer is not limited to any specific one.

Hereinafter, a synthesis method of a compound and a polymer represented by General Formulas 1 and 2 is illustrated in detail with the following Reaction Schemes 1 to 4.

In addition to the method according to the following Reaction Schemes, a monomer comprising silicon and/or tin of the present invention and a polymer thereof may be prepared by other methods so long as the final product has the same structure as the monomer or the polymer.

Thus, in the reaction for preparing a monomer comprising silicon and/or tin of the present invention and a (co)polymer formed by polymerizing the monomer, a solvent, reaction temperature, concentration, catalyst, and the like do not need to be specifically limited, and a preparation yield need not be specifically limited, either.

[Reaction Scheme 1]

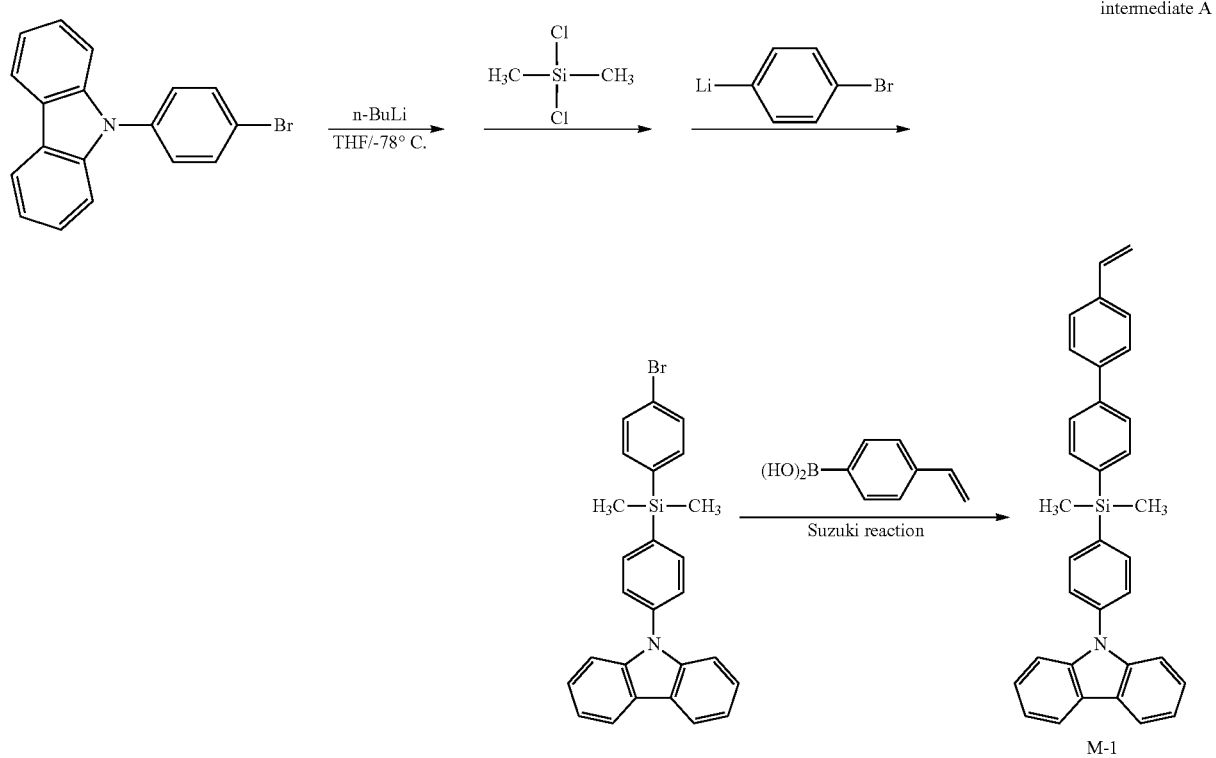

-continued
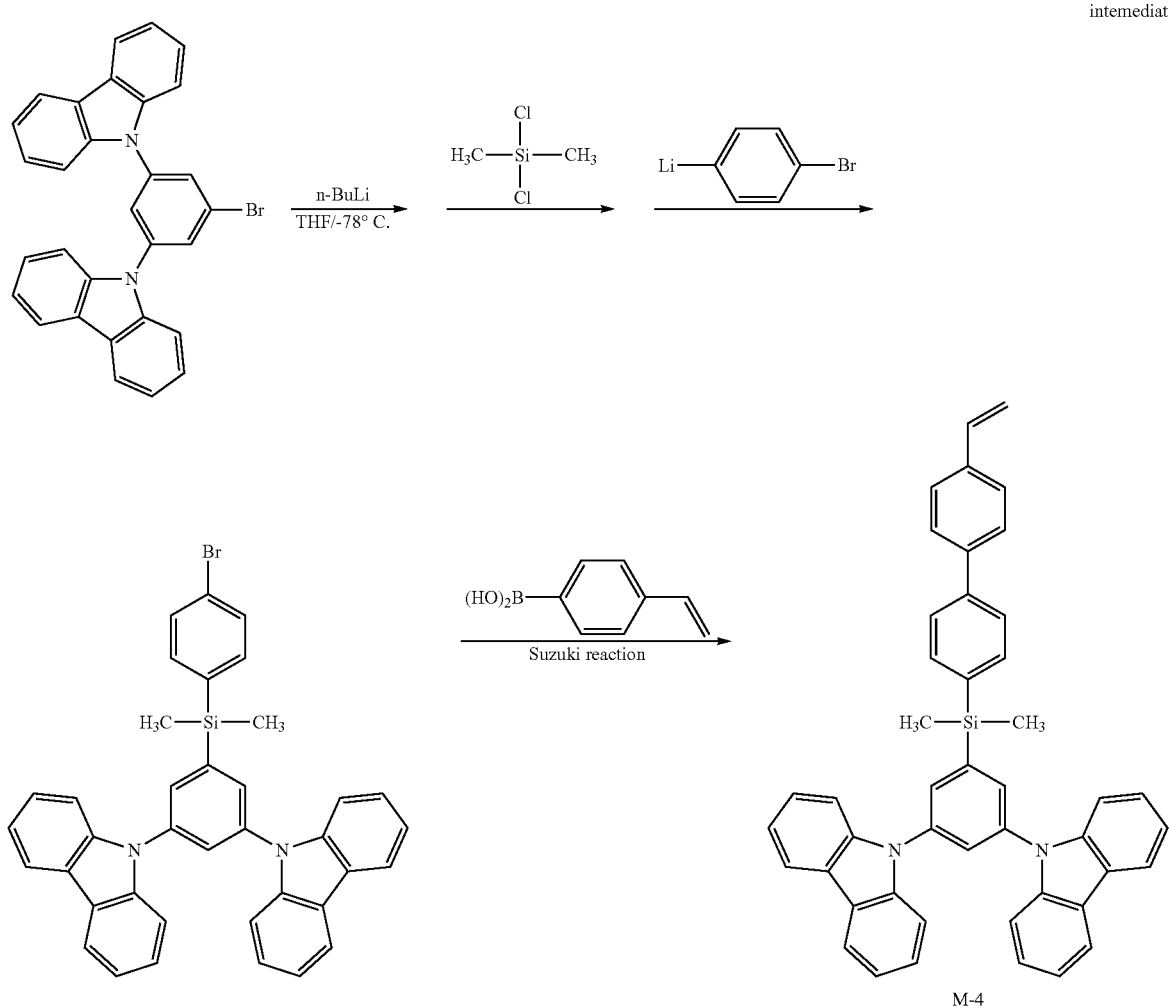
intermediate B
M-4

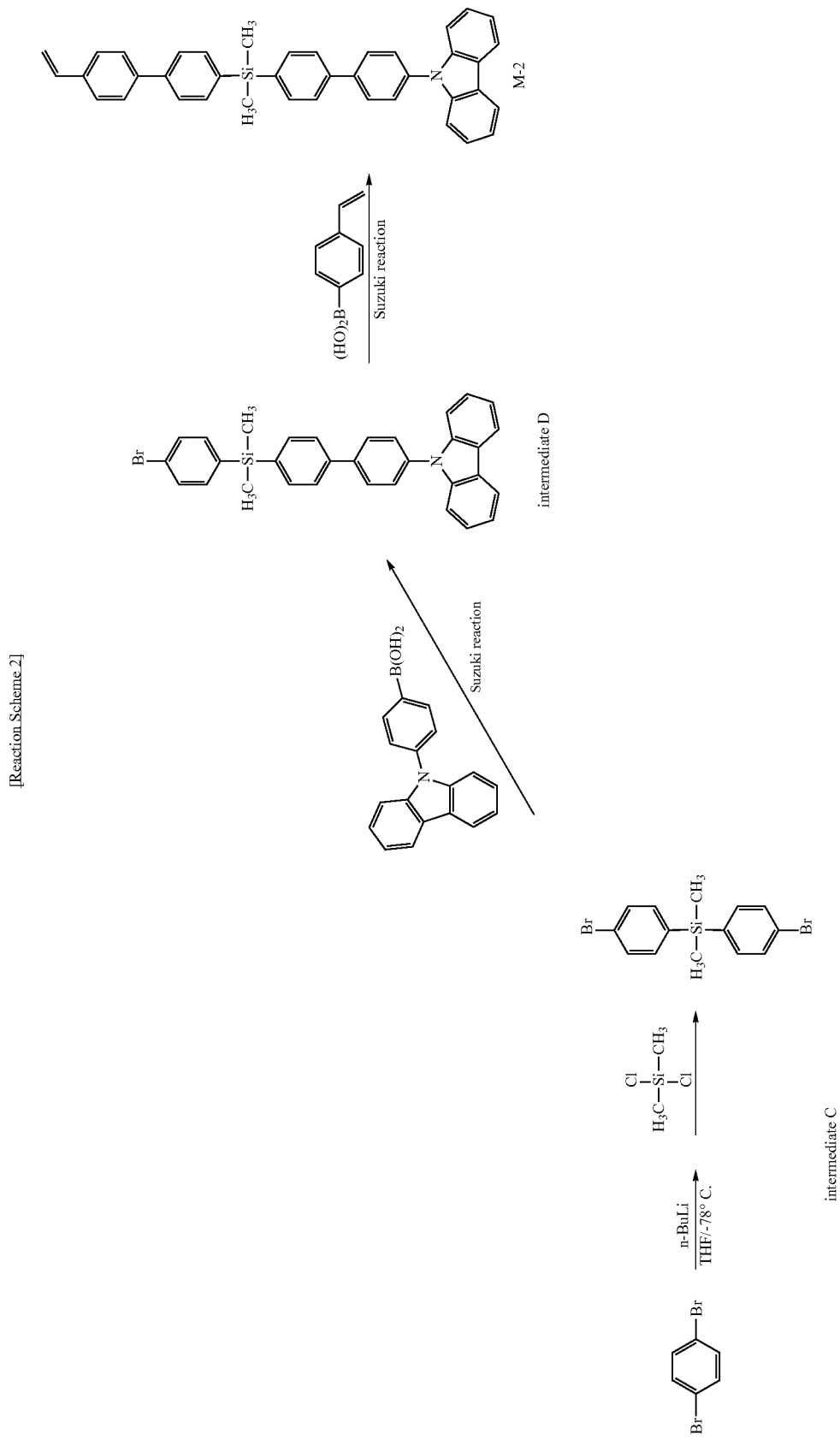

-continued
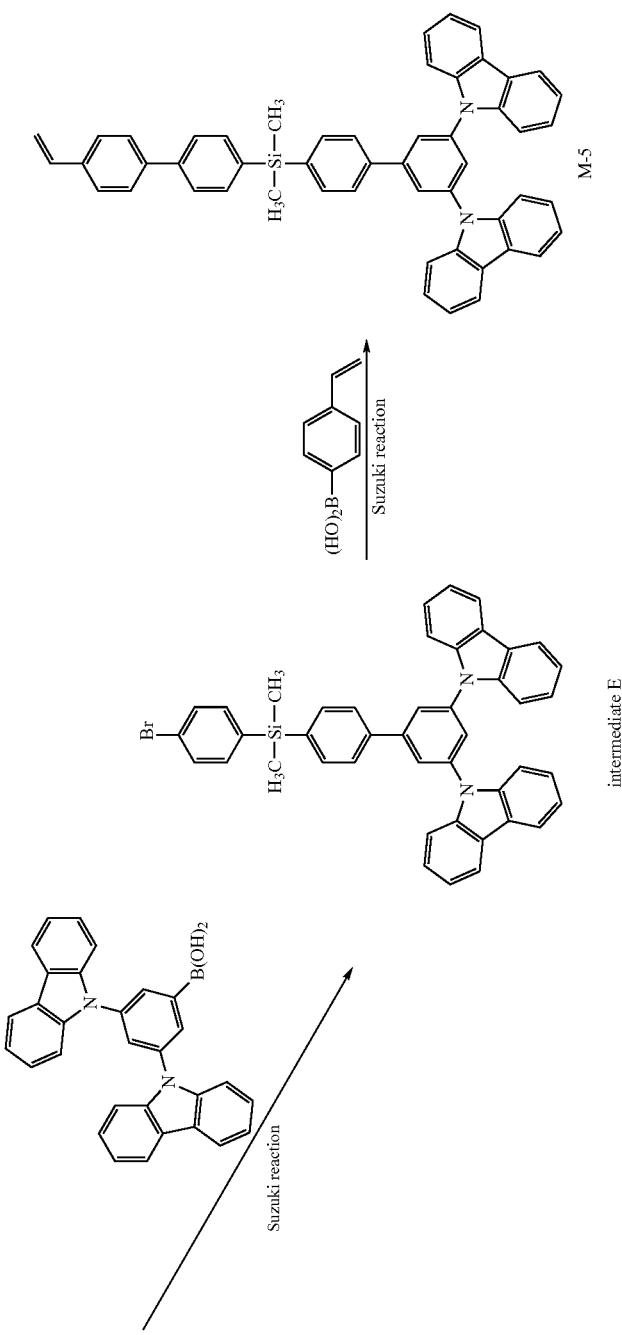

[Reaction Scheme 3]
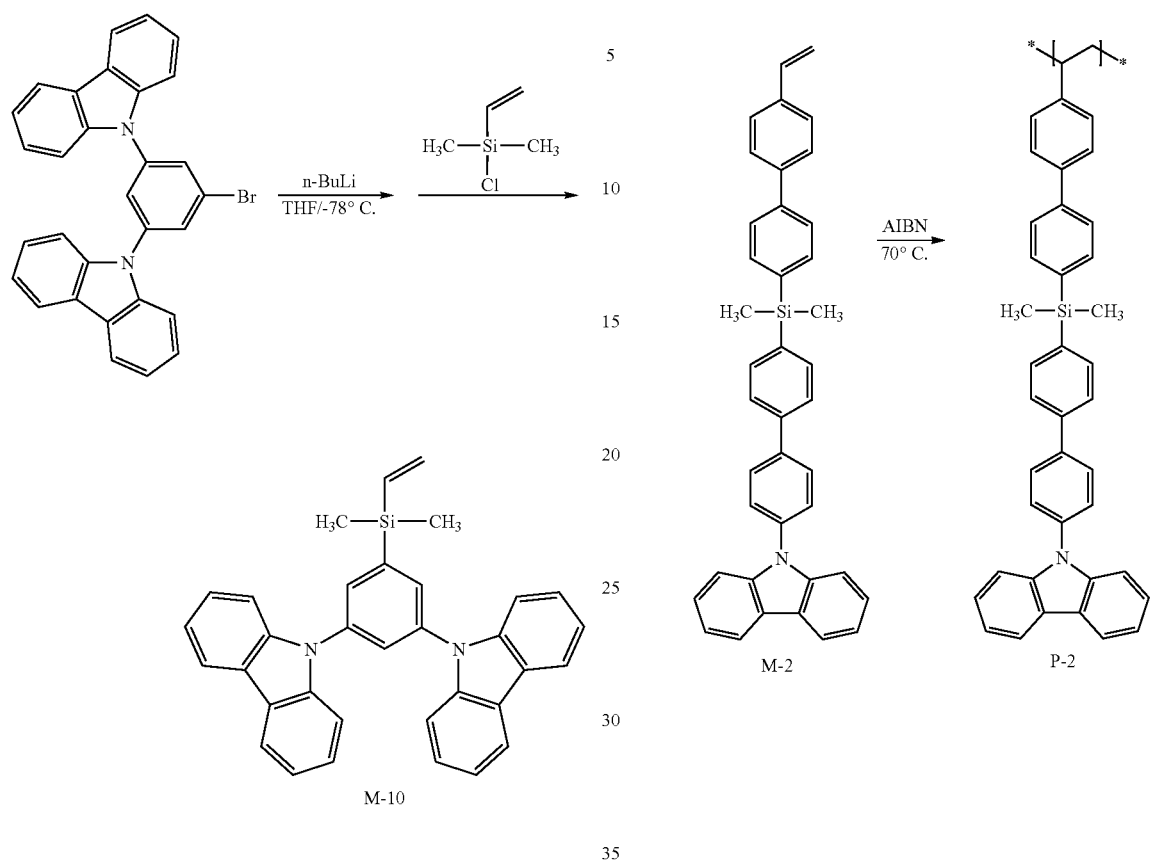
[Reaction Scheme 4]
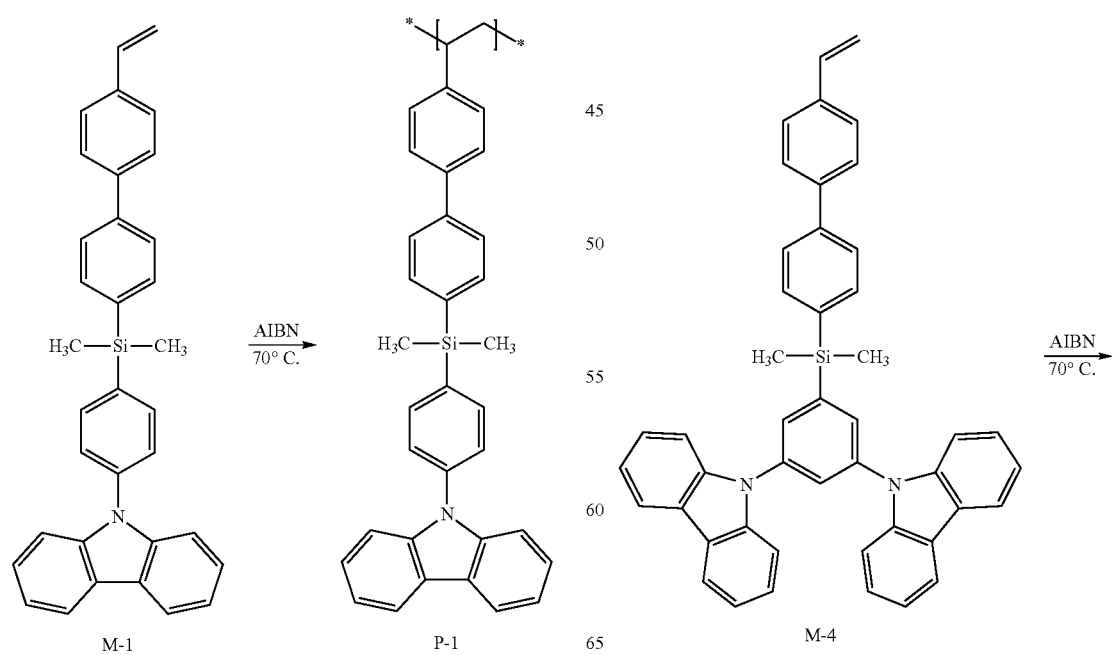

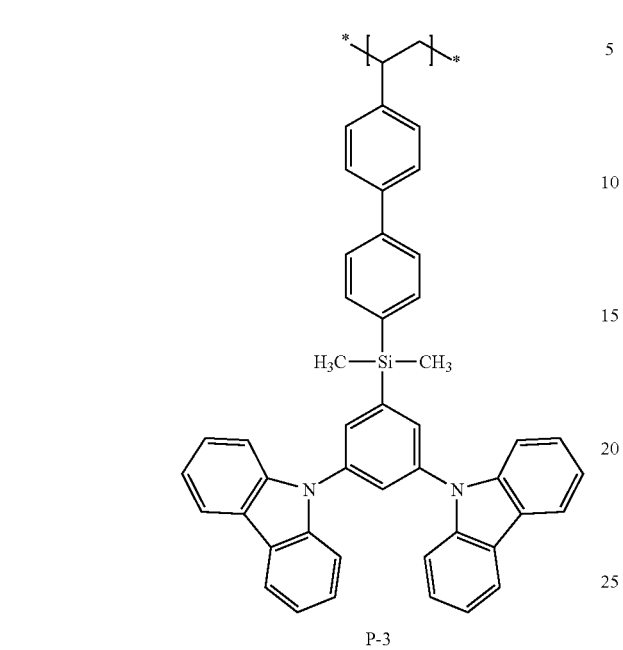
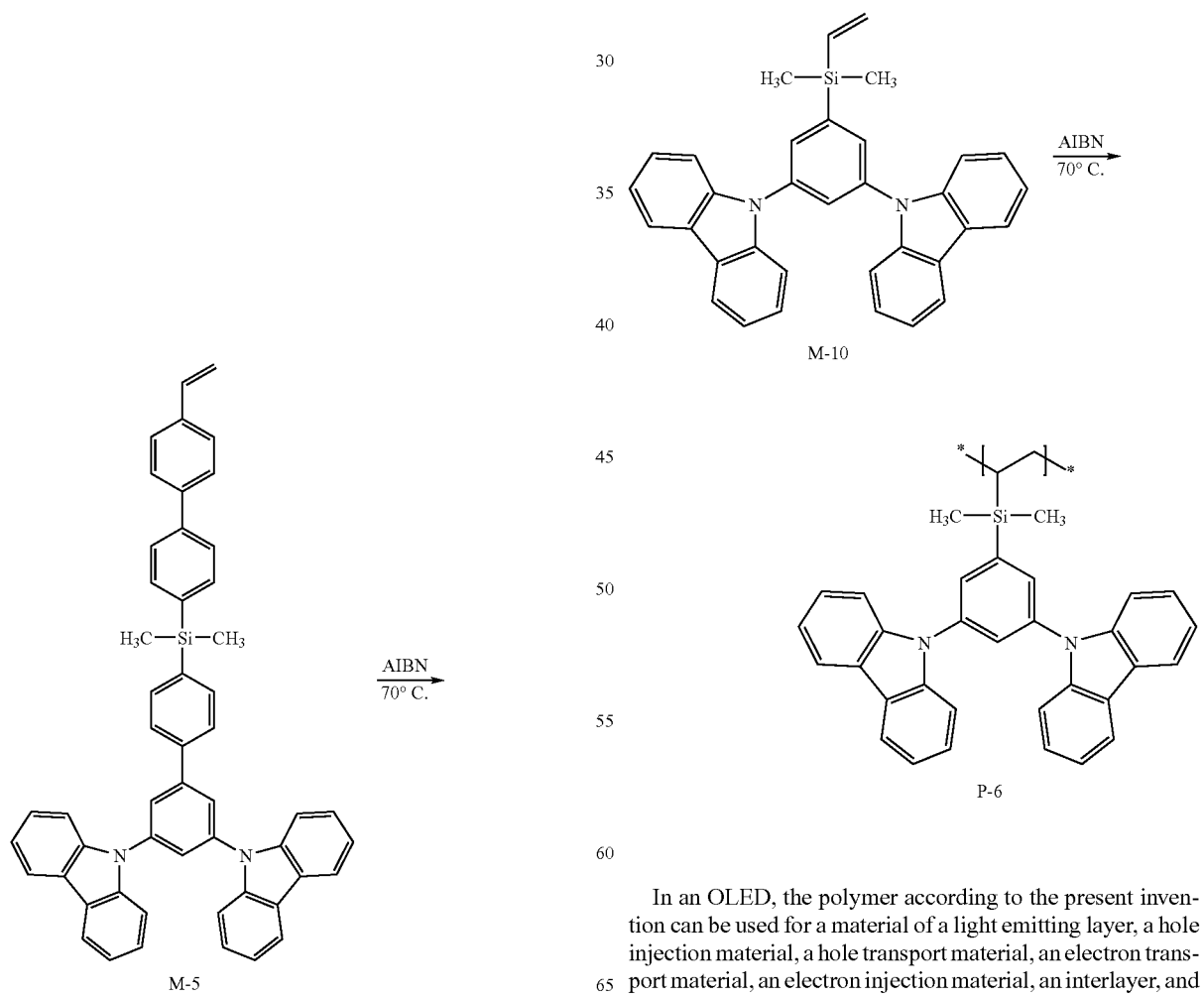
In an OLED, the polymer according to the present invention can be used for a material of a light emitting layer, a hole injection material, a hole transport material, an electron transport material, an electron injection material, an interlayer, and a material for a hole blocking layer. Preferably, the polymer is used for a host material of the light emitting layer.

The OLED of the present invention optionally includes an interlayer, a hole transport layer, and an electron transport layer in addition to general components including an anode, a light emitting layer, and a cathode.

FIG. 1 is a cross-sectional view of an OLED including a substrate, anode, hole transport layer, light emitting layer, electron transport layer, and cathode.

A method of manufacturing an electroluminescent display employing an organic electroluminescent polymer according to the present invention will be described with reference to FIG. 1.

First, a substrate 11 is coated with an electrode material for an anode 12.

Here, the substrate 11 employs a typical substrate for an OLED, and is preferably a glass substrate or a transparent plastic substrate which ensures excellent transparency, a smooth surface, easy handling, and waterproofing.

Examples of the electrode material for the anode 12 include indium tin oxide (ITO), tin oxide ($SnO_2$), zinc oxide (ZnO), etc., which are transparent and have excellent conductivity.

A hole transport layer 13 is formed on the anode 12 by vacuum deposition, sputtering or spin coating, and a light emitting layer 14 is formed thereon by vacuum deposition, spin coating or solution coating such as ink-jet printing.

An electron transport layer 15 is formed on the light emitting layer 14 before forming a cathode 16.

Here, the light emitting layer 14 has a thickness of 5 nm to 1 μm, preferably 10 to 500 nm, and each of the hole transport layer 13 and the electron transport layer 15 has a thickness of 10~10,000 Å.

The electron transport layer 15 can be formed of a material generally used in the art by vacuum deposition, sputtering or spin coating.

The hole transport layer 13 and electron transport layer 15 serve to enhance luminous recombination in a light emitting polymer by efficiently transferring carriers to the light emitting polymer.

According to the present invention, materials for the hole transport layer 13 and electron transport layer 15 are not limited to particular ones. Examples of the material for the hole transport layer include PEDOT:PSS, which is poly(3,4-ethylenedioxy-thiophene) (PEDOT) doped with a (poly(styrene sulfonic acid) (PSS) layer, and N,N'-bis(3-methylphenyl)-N,N-diphenyl-[1,1'-biphenyl]-4,4'-diamine (TPD). Further, examples of the material for the electron transport layer include aluminum trihydroxyquinoline (Alq3), PBD (2-(4-biphenyl)-5-phenyl-1,3,4-oxadiazole), which is a 1,3, 4-oxadiazole derivative, TPQ (1,3,4-tris[(3-phenyl-6-trifluoromethyl)quinoxaline-2-yl]benzene), which is a quinoxaline derivative, and triazole derivatives.

The polymer of the present invention can be used in combination with a phosphorescent organic compound. Here, the phosphorescent organic compound is an organic metal complex that can be phosphorescent in a triplet state and contains a metal ion selected at least from Group VIII in the periodic table of Gregor Johann Mendel, i.e., Fe, Co, Ni, Ru, Ph, Os, Ir, and Pt. Preferably, the phosphorescent organic compound is a metal complex containing Ir or Pt ions.

The following Chemical Formula 6 represents examples of the metal complex, but it should be noted that the present invention is not limited to these examples.

[Chemical formula 6]

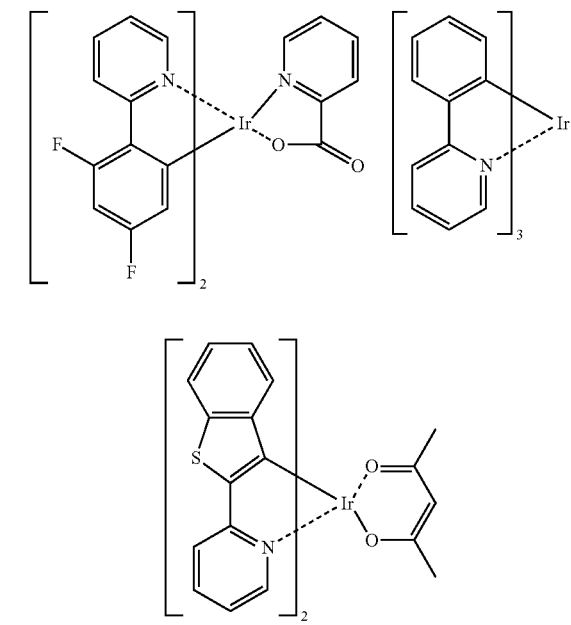

When the polymer according to the present invention is subjected to solution coating to form a layer, it may be blended with a low molecular weight host. The following chemical formula 7 represents illustrative examples of the low molecular weight host, but it should be noted that the present invention is not limited to these examples.

[Chemical formula 7]

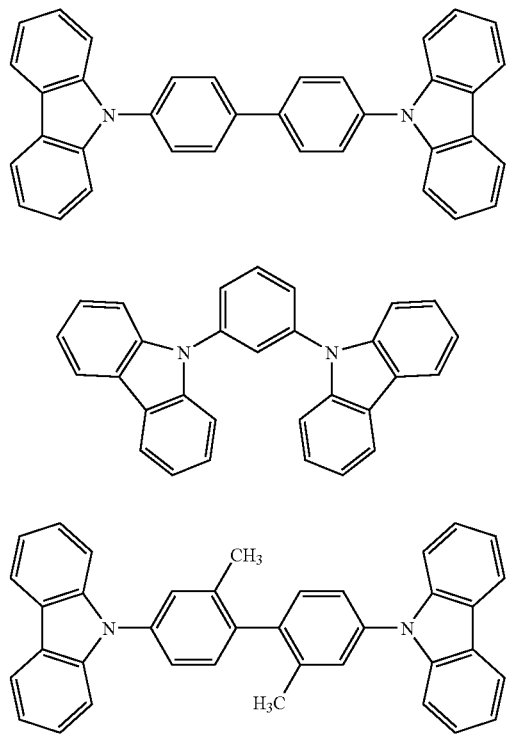

-continued

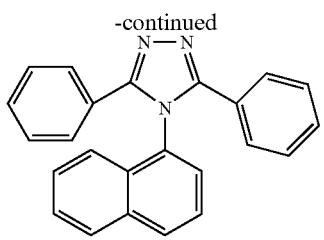

Further, the polymer may be blended with a polymer having a conjugated double bond, such as a fluorine-based polymer, polyphenylenevinylene, and polyparaphenylene. If necessary, it may be mixed with a binder resin.

Examples of the binder resin include polyvinylcarbazole, polycarbonate, polyester, polyarylate, polystyrene, acryl polymer, methacryl polymer, polybutyral, polyvinylacetal, diallylphthalate polymer, phenol resin, epoxy resin, silicone resin, polysulfone resin, urea resin, and the like. These resins may be used alone or in combinations thereof.

Optionally, a hole blocking layer of lithium fluoride (LiF) may further be formed by vacuum deposition and the like to control a hole-transport speed in the light emitting layer 14 and to increase recombination efficiency between electrons and holes.

Finally, the electron transport layer 15 is coated with an electrode material for the cathode 16.

Examples of the metal for the cathode includes lithium (Li), magnesium (Mg), calcium (Ca), aluminum (Al), and Al:Li, Ba:Li, Ca:Li, and the like, which have a low work function.

Hereinafter, illustrative examples for preparation of a vinyl-based monomer comprising silicon and/or tin and a copolymer formed by polymerizing the same according to the embodiments of the present invention will be described. However, it should be noted that the following examples are given by way of illustration only and do not limit the present invention.

Also, a description for the matter apparent to those skilled in the art will be omitted herein.

Example 1

Preparation of Intermediate A

N-(4-Bromophenyl)carbazole (5 g, 15.51 mmol) was dissolved in anhydrous diethyl ether (50 ml) under a nitrogen atmosphere, followed by dropwise addition of n-butyl lithium (10.7 ml, 17.06 mmol) at −78° C. and stirring the mixture for one hour.

Dichloromethylsilane (2 g, 15.51 mmol) was added to anhydrous diethyl ether (30 ml), followed by cooling to −78° C. and slowly dropping the produced carbazole product into the solution.

The mixture was stirred at −78° C. for 20 minutes and then stirred at room temperature for one hour.

After cooling the mixture to −78° C., 4-4'-dibromobenzene (3.65 g, 15.51 mmol) was dissolved in anhydrous diethyl ether (30 ml) and n-butyl lithium (10.7 ml, 17.06 mmol) was added dropwise, followed by stirring for one hour.

The product was slowly dropped into a silicon compound. The resultant mixture was stirred at −78° C. for 20 minutes and then stirred at room temperature for 8 hours or more.

When the reaction was completed, extraction of the mixture was carried out with ethyl ether, followed by washing with water and 10% sodium bicarbonate several times and drying over anhydrous magnesium sulphate.

The resultant product was filtered to remove the solvent and refined on a silica gel column using a blended solvent of methylene chloride/hexane (1/3), thereby obtaining 3.1 g (43.8%) of Intermediate A.

Example 2

Preparation of Monomer M-1

3.1 g (6.79 mmol) of Intermediate A, 1.0 g (6.79 mmol) of vinylphenylboronic acid, and 0.15 g of tetrakistriphenylphosphine palladium were dissolved in tetrahydrofuran (THF) under an argon atmosphere in a 250 ml round-bottom flask equipped with a thermometer, a reflux condenser, and a stirrer. Then, 20 ml of 2M potassium carbonate was added to the dissolved mixture and refluxed at 75° C. for 48 hours.

When the reaction was completed, the resultant solution was cooled to room temperature, followed by extraction with methylene chloride several times and washing the extracted substance with water several times.

After removal of water using anhydrous magnesium sulphate, the extracted substance was filtered to remove the solvent. The resultant product was refined on a silica gel column using a blended solvent of methylene chloride/hexane (1/3), thereby obtaining 2.32 g (71.3%) of Monomer M-1.

The monomer had a maximum luminous wavelength of 348 nm in its solution state.

Example 3

Preparation of Intermediate B 9-(3-Bromo-5-(9H-carbazole-9-yl)phenyl-9H-carbazole (10 g, 20.5 mmol) was dissolved in anhydrous diethyl ether (60 ml) under a nitrogen atmosphere, followed by dropwise addition of n-butyl lithium (15.4 ml, 24.6 mmol) at −78° C. and stirring the mixture for one hour.

Dichloromethylsilane (2.91 g, 22.5 mmol) was added to anhydrous diethyl ether (50 ml), followed by cooling to −78° C. and slowly dropping the produced carbazole product into the solution.

The mixture was stirred at −78° C. for 20 minutes and then stirred at room temperature for one hour.

After cooling the mixture down to −78° C., 4-4'-dibromobenzene (5.3 g, 22.5 mmol) was dissolved in anhydrous diethyl ether (50 ml) and n-butyl lithium (16.87 ml, 27 mmol) was added dropwise, followed by stirring for one hour.

The product was slowly dropped into a silicon compound. The resultant mixture was stirred at −78° C. for 20 minutes and then stirred at room temperature for 8 hours or more.

When the reaction was completed, extraction of the mixture was carried out with ethyl ether, followed by washing with water and 10% sodium bicarbonate several times and drying with anhydrous magnesium sulphate.

The resultant product was filtered to remove the solvent, refined on a silica gel column using a blended solvent of methylene chloride/hexane (1/2), and recrystallized in hexane, thereby obtaining 2.28 g (41.4%) of Intermediate B.

Example 4

Preparation of Monomer M-4 in Chemical Formula 1

3.0 g (4.82 mmol) of the intermediate B, 0.75 g (5.06 mmol) of vinylphenylboronic acid, and 0.13 g of tetrakistriphenylphosphine palladium were dissolved in THF under an argon atmosphere in a 250 ml round-bottom flask equipped with a thermometer, a reflux condenser, and a stirrer. Then, 20 ml of 2M potassium carbonate was added to the dissolved mixture and refluxed at 75° C. for 48 hours.

When the reaction was completed, the resultant solution was cooled to room temperature, followed by extraction with methylene chloride several times and washing the extracted substance with water several times.

After removal of water using anhydrous magnesium sulphate, the extracted substance was filtered to remove the solvent. The resultant product was refined on a silica gel column using a blended solvent of methylene chloride/hexane (1/2), thereby obtaining 1.37 g (43.4%) of Monomer M-2.

The monomer had a maximum luminous wavelength of 346 nm in its solution state.

Example 5

Preparation of Intermediate C 4-4'-dibromobenzene (20.0 g, 84.77 mmol) was dissolved in anhydrous diethyl ether (80 ml) under a nitrogen atmosphere, followed by dropwise addition of n-butyl lithium (63.5 ml, 101.7 mmol) at −78° C. and stirring the mixture for one hour.

Dichloromethylsilane (4.75 g, 36.8 mmol) was added to anhydrous diethyl ether (40 ml), followed by cooling to −78° C. and slowly dropping the produced carbazole product into the solution.

The mixture was stirred at −78° C. for 20 minutes and then stirred at room temperature for one hour.

When the reaction was completed, extraction of the mixture was carried out with ethyl ether, followed by washing with water and 10% sodium bicarbonate several times and drying with anhydrous magnesium sulphate.

The resultant product was filtered to remove the solvent, refined on a silica gel column using a solvent of hexane, and recrystallized in hexane, thereby obtaining 6.4 g (47%) of Intermediate C as white crystals.

Example 6

Preparation of Intermediate D 4.0 g (10.08 mmol) of the intermediate C, 9-(4-(4,4,5,5-tetramethyl-1,3,2-dioxaborolan-2-yl)phenyl)-9H-carbazole (10.5 mmol), and 0.22 g of tetrakistriphenylphosphine palladium were dissolved in THF under an argon atmosphere in a 250 ml round-bottom flask equipped with a thermometer, a reflux condenser, and a stirrer. Then, 20 ml of 2M potassium carbonate was added to the dissolved mixture and refluxed at 75 t for 48 hours.

When the reaction was completed, the resultant solution was cooled to room temperature, followed by extraction with methylene chloride several times and washing the extracted substance with water several times.

After removal of water using anhydrous magnesium sulphate, the extracted substance was filtered to remove the solvent. The resultant product was refined on a silica gel column using a blended solvent of methylene chloride/hexane (1/2), thereby obtaining 2.8 g (50.0%) of Intermediate D.

Example 7

Preparation of Monomer M-2 in Chemical Formula 1

2.53 g (4.75 mmol) of the intermediate D, 0.77 g (5.22 mmol) of vinylphenylboronic acid, and 0.12 g of tetraki-striphenylphosphine palladium were dissolved in THF under an argon atmosphere in a 250 ml round-bottom flask equipped with a thermometer, a reflux condenser, and a stirrer. Then, 20 ml of 2M potassium carbonate was added to the dissolved mixture and refluxed at 75° C. for 48 hours.

When the reaction was completed, the resultant solution was cooled to room temperature, followed by extraction with methylene chloride several times and washing the extracted substance with water several times.

After removal of water using anhydrous magnesium sulphate, the extracted substance was filtered to remove the solvent. The resultant product was refined on a silica gel column using a blended solvent of methylene chloride/hexane (1/3), thereby obtaining 1.7 g (64.4%) of Monomer M-2.

The monomer had a maximum luminous wavelength of 370 nm in its solution state.

Example 8

Preparation of Intermediate E 4.0 g (10.8 mmol) of the intermediate C, 3-(9H-carbazole-9-yl)-5-(4,4,5,5-tetramethyl-1,3,2-dioxaborolan-2-yl)phenyl)-9H-carbazole (10.5 mmol), and 0.22 g of tetrakistriphenylphosphine palladium were dissolved in THF under an argon atmosphere in a 250 ml round-bottom flask equipped with a thermometer, a reflux condenser, and a stirrer. Then, 20 ml of 2M potassium carbonate was added to the dissolved mixture and refluxed at 75° C. for 48 hours.

When the reaction was completed, the resultant solution was cooled to room temperature, followed by extraction with methylene chloride several times and washing the extracted substance with water several times.

After removal of water using anhydrous magnesium sulphate, the extracted substance was filtered to remove the solvent. The resultant product was refined on a silica gel column using a blended solvent of methylene chloride/hexane (1/2), thereby obtaining 3.5 g (47.8%) of Intermediate E.

Example 9

Preparation of Monomer M-5 in Chemical Formula 1

3.0 g (4.29 mmol) of the intermediate E, 0.7 g (4.72 mmol) of vinylphenylboronic acid, and 0.1 g of tetrakistriphenylphosphine palladium were dissolved in THF under an argon atmosphere in a 250 ml round-bottom flask equipped with a thermometer, a reflux condenser, and a stirrer. Then, 20 ml of 2M potassium carbonate was added to the dissolved mixture and refluxed at 75° C. for 48 hours.

When the reaction was completed, the resultant solution was cooled to room temperature, followed by extraction with methylene chloride several times and washing the extracted substance with water several times.

After removal of water using anhydrous magnesium sulphate, the extracted substance was filtered to remove the solvent. The resultant product was refined on a silica gel column using a blended solvent of methylene chloride/hexane (1/3), thereby obtaining 1.87 g (60.5%) of Monomer M-5.

The monomer had a maximum luminous wavelength of 380 nm in its solution state.

Example 10

Preparation of Monomer M-10 in Chemical Formula 1

9-(3-Bromo-5-(9H-carbazole-9-yl)phenyl-9H-carbazole (10.2 mmol) was dissolved in anhydrous diethyl ether (50 ml)

under a nitrogen atmosphere, followed by adding n-butyl lithium (7.1 ml, 11.2 mmol) by drops at −78° C. and stirring for one hour.

Chlorodimethylvynylsilane (1.23 g, 10.2 mmol) was added to anhydrous diethyl ether (20 ml), followed by cooling to −78° C. and slowly dropping the afore-prepared product into the solution.

The mixture was stirred at −78° C. for 20 minutes and then stirred at room temperature for one hour. When the reaction was completed, extraction of the mixture was carried out with ethyl ether, followed by washing with water and 10% sodium bicarbonate several times and drying with anhydrous magnesium sulphate.

The resultant product was filtered to remove the solvent and refined on a silica gel column using a blended solvent of methylene chloride/hexane (1/3), thereby obtaining 2.9 g (58%) of Monomer M-10.

Example 11

Preparation of Polymer P-1 in Chemical Formula 2

0.7 g (1.45 mmol) of Monomer M-1 and 2.4 mg (0.014 mmol) of AIBN were dissolved in 2.5 ml of NMP under a nitrogen atmosphere. The mixture was degassed by a freeze-pump-thaw process and stirred at 70° C. for 48 hours. Then, the reactant was precipitated in methanol to obtain a white polymer.

The resultant product was filtered and re-dissolved in chloroform to be re-precipitated.

The re-precipitated polymer was filtered and refined using acetone in a Soxhlet device for 24 hours, thereby obtaining 0.45 g of a polymer.

The polymer had a maximum luminous wavelength of 348 nm in its solution state.

Example 12

Preparation of Polymer P-2 in Chemical Formula 2

0.7 g (1.26 mmol) of Monomer M-2 and 2.0 mg (0.012 mmol) of AIBN were dissolved in 2.5 ml of NMP under a nitrogen atmosphere. The mixture was degassed by a freeze-pump-thaw process and stirred at 70° C. for 48 hours. Then, the reactant was precipitated in methanol to obtain a white polymer.

The polymer was filtered and re-dissolved in chloroform to be re-precipitated.

Then, the re-precipitated polymer was filtered and refined using acetone in a Soxhlet device for 24 hours, thereby obtaining 0.23 g of a polymer.

The polymer had a maximum luminous wavelength of 370 nm in its solution state.

Example 13

Preparation of Polymer P-3 in Chemical Formula 2

0.7 g (1.08 mmol) of Monomer M-4 and 1.7 mg (0.010 mmol) of AIBN were dissolved in 2.3 ml of NMP under a nitrogen atmosphere. The mixture was degassed by a freeze-pump-thaw process and stirred at 70° C. for 48 hours. Then, the reactant was precipitated in methanol to obtain a white polymer.

The polymer was filtered and re-dissolved in chloroform to be re-precipitated.

Then, the re-precipitated polymer was filtered and refined using acetone in a Soxhlet device for 24 hours, thereby obtaining 0.42 g of a polymer.

The polymer had a maximum luminous wavelength of 346 nm in its solution state.

Example 14

Preparation of Polymer P-4 in Chemical Formula 2

0.7 g (0.97 mmol) of Monomer M-5 and 1.6 mg (0.0097 mmol) of AIBN were dissolved in 2.3 ml of NMP under a nitrogen atmosphere. The mixture was degassed by a freeze-pump-thaw process and stirred at 70° C. for 48 hours. Then, the reactant was precipitated in methanol to obtain a white polymer.

The polymer was filtered and re-dissolved in chloroform to be re-precipitated.

Then, the re-precipitated polymer was filtered and refined using acetone in a Soxhlet device for 24 hours, thereby obtaining 0.49 g of a polymer.

The polymer had a maximum luminous wavelength of 380 nm in its solution state.

Example 15

Preparation of Polymer P-6 in Chemical Formula 2

0.8 g (0.97 mmol) of Monomer M-10 and 2.66 mg (0.0162 mmol) of AIBN were dissolved in 2.3 ml of NMP under a nitrogen atmosphere. The mixture was degassed by a freeze-pump-thaw process and stirred at 70° C. for 48 hours. Then, the reactant was precipitated in methanol to obtain a white polymer.

The polymer was filtered and re-dissolved in chloroform to be re-precipitated.

The re-precipitated polymer was filtered and refined using acetone in a Soxhlet device for 24 hours, thereby obtaining 0.3 g of a polymer.

Example 16

Evaluation of Characteristics of Device

An ITO substrate as an anode was treated by spin coating to form PEDOT. With a polymer host doped into the PEDOT with a dopant by 7%, a light emitting layer was formed on the PEDOT by spin coating. BAlq was vacuum-deposited on the light emitting layer to form a hole blocking layer having a thickness of 50 Å. Then, Alq3 was vacuum-deposited on the light emitting layer to form an electron transport layer having a thickness of 200 Å. On the electron transport layer were sequentially vacuum-deposited LiF to 10 Å and Al to 1000 Å to form a cathode, thereby producing an OLED.

The OLED manufactured according to this example had a threshold voltage, and driving voltage, current efficiency and power efficiency at 1000 nit, as shown in Table 1.

Structure of Evaluated Device: Al (1000 Å)/LiF (10 Å)/Alq3 (200 Å)/Balq (50 Å)/EML (polymer host+Ir (ppy) 3)/PEDOT/ITO (1500 Å)

TABLE 1

| Kind of Device | Compound | Von | At 1000 nit ||| 
| | | | V | cd/A | lm/W |
|---|---|---|---|---|---|
| Green | P-1 | 4.6 | 12.3 | 4.7 | 1.2 |
| | P-2 | 4.0 | 11.9 | 4.0 | 1.0 |
| | P-3 | 4.2 | 10.3 | 7.8 | 2.4 |

Example 17

Evaluation of Characteristics of Device

An ITO substrate as an anode was treated with spin coating to form PEDOT. With the mixture of P-4 and CBP in the weight ratio of 1:2 doped into the PEDOT with a dopant by 7%, a light emitting layer was formed on the PEDOT by spin coating. BAlq was vacuum-deposited on the light emitting layer to form a hole blocking layer having a thickness of 50 Å. Then, Alq3 was vacuum-deposited on the light emitting layer to form an electron transport layer having a thickness of 200 Å. On the electron transport layer were sequentially vacuum-deposited LiF to 10 Å and Al to 1000 Å to form a cathode, thereby producing an OLED. A comparative device included PVK as a polymer host.

Structure of Evaluated Device: Al (1000 Å)/LiF (10 Å)/Alq3 (200 Å)/Balq (50 Å)/EML (P-4+CBP+Ir(ppy)3)/PEDOT/ITO (1500 Å)

Structure of Comparative Device: Al (1000 Å)/LiF (10 Å)/Alq3 (200 Å)/Balq (50 Å)/EML (PVK+CBP+Ir(ppy)3)/PEDOT/ITO (1500 Å)

The OLED manufactured according to the foregoing examples had a threshold voltage, and driving voltage, current efficiency and power efficiency of 1000 nit, as shown in Table 2.

TABLE 2

| Kind of Device | Compound | Von | At 1000 nit |||
| | | | V | cd/A | lm/W |
|---|---|---|---|---|---|
| Green | PVK | 4 | 7.4 | 15.3 | 6.63 |
| | P-4 | 3.6 | 7.4 | 16.8 | 7.14 |

Although the exemplary embodiments of the invention have been illustrated with reference to the accompanying drawings, the present invention is not limited to the embodiments and drawings. It should be understood that various modifications, changes, and substitutions can be made by those skilled in the art without departing from the spirit and scope of the present invention as disclosed in the accompanying claims. Therefore, it should be understood that the exemplary embodiments described above are given by way of illustration only and do not limit the scope of the present invention.

The invention claimed is:

1. A polymer for an organic layer of an organic light emitting diode, the polymer comprising a repeat unit represented by General Formula 2, and formed by polymerization of a monomer represented by General Formula 1:

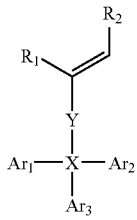

[General Formula 1]

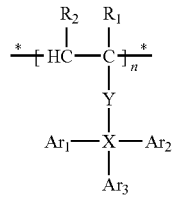

[General Formula 2]

wherein in General Formulas 1 and 2:
X represents silicon (Si) or tin (Sn);
$Ar_1$, $Ar_2$, and $Ar_3$ are the same or different and each represents a C1-C30 substituted or non-substituted alkyl group, a C1-C30 substituted or non-substituted acyl group, a C1-C30 substituted or non-substituted alkoxycarbonyl group, a C1-C30 substituted or non-substituted alkoxy group, a C2-C30 substituted or non-substituted alkenyl group, a C2-C30 substituted or non-substituted alkynyl group, a C2-C30 substituted or non-substituted alkylcarboxyl group, a C6-C30 substituted or non-substituted aryl group, a C6-C30 substituted or non-substituted aralkyl group, a C6-C30 substituted or non-substituted aralkyloxy group, a C2-C30 substituted or non-substituted heteroaryl group, a C2-C30 substituted or non-substituted heteroaryloxy group, a C6-C30 substituted or non-substituted aryloxy group, or a C4-C30 substituted or non-substituted cycloalkyl group;
Y represents a single bond, a substituted or non-substituted alkylene group, a substituted or non-substituted cycloalkylene group, a substituted or non-substituted acyl group, a substituted or non-substituted alkenylene group, a substituted or non-substituted alkynylene group, a C7-C30 substituted or non-substituted arylene group, a substituted or non-substituted pyridine group, a substituted or non-substituted pyrimidine group, a substituted or non-substituted oxyalkylene group, a substituted or non-substituted oxyarylene group, a substituted or non-substituted oxycarbonyl group, a substituted or non-substituted alkoxycarbonyl group, a substituted or non-substituted alkylcarboxyl group, a substituted or non-substituted amide group, or a substituted or non-substituted urethane group;
$R_1$ and $R_2$ are the same or different and each represents a hydrogen atom, an alkyl group, an alkenyl group, an aryl group, an alkoxy group, an aryloxy group, a hetero-oxy group, a silyloxy group, an acyl group, an alkoxycarbonyl group, an acyloxy group, an acylamino group, an alkoxycarbonylamino group, an allyloxycarbonylamino group, a sulfamoylamino group, a sulfonyl group, an alkylthio group, an arylthio group, a heterocyclic thiol group, a sulfonyl group, an ureide group, a phosphoamide group, a hydroxyl group, a halogen, a cyano group, a sulfone group, a carboxyl group, a nitro group, a heteroatom, or a silyl group; and
n is an integer from 1 to 1,000,000.

2. The polymer as claimed in claim 1, further comprising a repeat unit represented by General Formula 4, and formed by polymerization of a monomer represented by General Formula 3:

[General Formula 3]

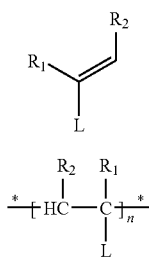

[General Formula 4]

$$*\text{\textemdash}\left[\text{HC}\overset{R_2}{\underset{}{\text{\textemdash}}}\overset{R_1}{\underset{L}{\text{C}}}\right]_n\text{\textemdash}*$$

wherein in General Formulas 3 and 4:

L represents a substituted or unsubstituted carbazole group, a substituted or unsubstituted triphenylamine group, a substituted or unsubstituted phenyl group, a substituted or unsubstituted naphthyl group, a substituted or unsubstituted anthracenyl group, or a substituted or unsubstituted pyridyl group, wherein the substituted carbazole group, the substituted triphenylamine group, the substituted phenyl group, the substituted naphthyl group, the substituted anthracenyl group, or the substituted pyridyl group are substituted by one or more of: a cyano group, a hydroxyl group, a C1-C30 (di-) alkylaminocarbonyl group, a halogen, a hydroxyl group, a silyl group, a C1-C30 alkyl group, a C6-C18 aryl group, a C1-C30 alkoxy group, a C1-C30 alkoxycarbonyl group, a C1-C30 acyloxy group, an acylamino group, a benzodiazole group, an oxidazole group, a triazole group, and a C1-C30 alkylcarbonyl group;

$R_1$ and $R_2$ are the same or different and each represents a hydrogen atom, an alkenyl group, an aryl group, an alkoxy group, an aryloxy group, a hetero-oxy group, a silyloxy group, an acyl group, an alkoxycarbonyl group, an acyloxy group, an acylamino group, an alkoxycarbonylamino group, an allyloxycarbonylamino group, a sulfamoylamino group, a sulfonyl group, an alkylthio group, an arylthio group, a heterocyclic thiol group, a sulfonyl group, an ureide group, a phosphoamide group, a hydroxyl group, a halogen, a cyano group, a sulfone group, a carboxyl group, a nitro group, a heteroatom, or a silyl group; and n is an integer from 1 to 1,000,000.

3. The polymer as claimed in claim 2, wherein the repeat unit represented by General Formula 2 forms at least 0.5% by weight of the entire polymer.

4. The polymer as claimed in claim 2, wherein the repeat unit represented by General Formula 4 forms at least 0.5% by weight of the entire polymer.

5. The polymer as claimed in claim 1 or 2, wherein the monomer represented by General Formula 1 is one of the monomers Q-1 to Q-6:

Q-1

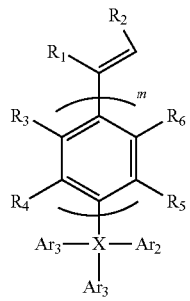

Q-2

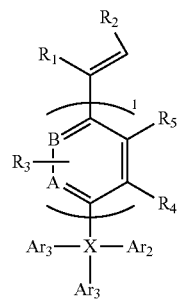

Q-3

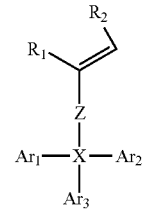

Q-4

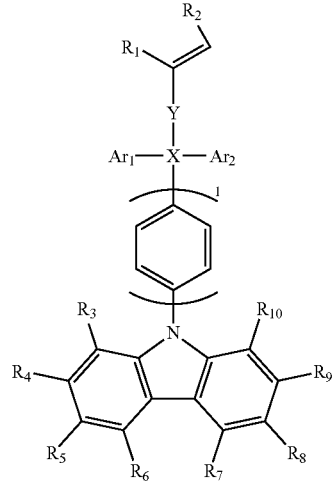

Q-5

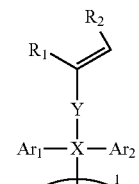

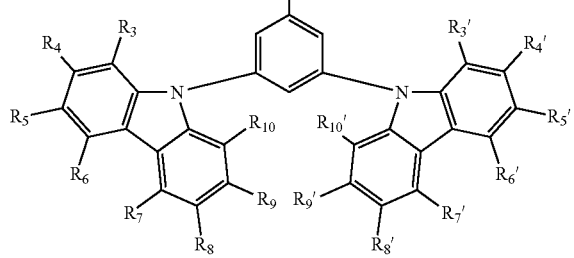

-continued

Q-6

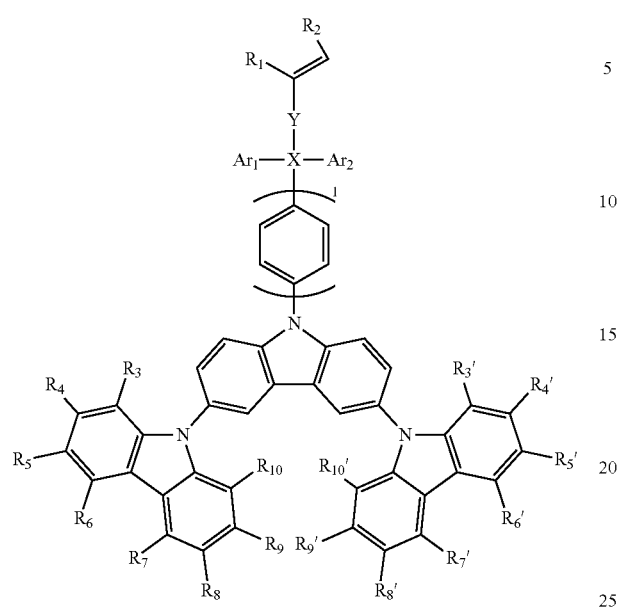

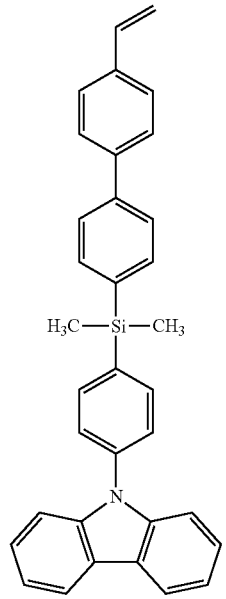

M-1 wherein in monomers Q-1 to Q-6, X, Y, $Ar_1$, $Ar_2$, $Ar_3$, $R_1$, and $R_2$ each represent the same groups as in General Formula 1, and:

Z represents a single bond, a C1-C30 substituted or non-substituted alkylene group, a C1-C30 substituted or non-substituted acyl group, a C1-C30 substituted or non-substituted alkoxycarbonyl group, a C1-C30 substituted or non-substituted oxyalkylene group, a C2-C30 substituted or non-substituted alkenylene group, a C2-C30 substituted or non-substituted alkynylene group, a C2-C30 substituted or non-substituted alkylcarboxyl group, or a substituted or non-substituted cycloalkylene group;

at least one of A and B is a nitrogen atom;

$R_3$-$R_{10}$ and $R_3'$-$R_{10}'$ are the same or different and each represents a C1-C30 substituted or non-substituted alkyl group, a C1-C30 substituted or non-substituted acyl group, a C1-C30 substituted or non-substituted alkoxycarbonyl group, a C1-C30 substituted or non-substituted alkoxy group, a C2-C30 substituted or non-substituted alkenyl group, a C2-C30 substituted or non-substituted alkynyl group, a C2-C30 substituted or non-substituted alkylcarboxyl group, a C6-C30 substituted or non-substituted aryl group, a C6-C30 substituted or non-substituted aralkyl group, a C6-C30 substituted or non-substituted aralkyloxy group, a C2-C30 substituted or non-substituted heteroaryl group, a C2-C30 substituted or non-substituted heteroaryloxy group, a C6-C30 substituted or non-substituted aryloxy group, a C4-C30 substituted or non-substituted cycloalkyl group, —N(R)(R'), a cyano group, a hydroxyl group, or a carboxyl group, wherein R and R' independently represent hydrogen, a C1-C30 alkyl group, a C6-C30 aryl group, or a C2-C30 heteroaryl group, and two or more neighboring groups of $R_3$-$R_{10}$ and $R_3'$-$R_{10}'$ are optionally connected to form a ring;

M is 0 or an integer from 2 to 10; and l is an integer from 0 to 10.

6. The polymer as claimed in claim 1 or 2, wherein the monomer represented by General Formula 1 is one of the monomers M-1 to M-6, M-17 to M-20, and M-22 to M-25:

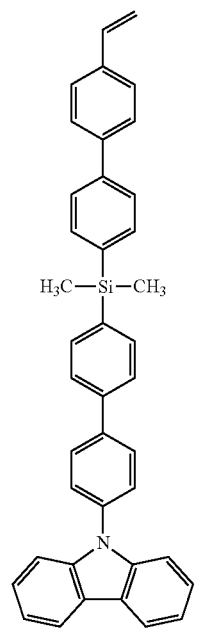

M-2

-continued
M-3
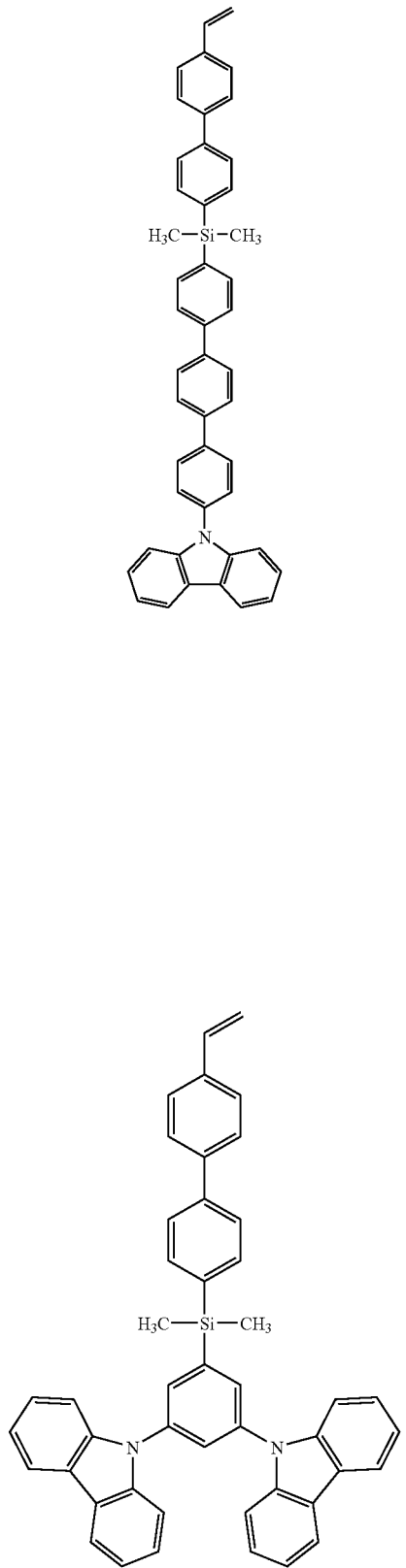
M-4
M-5
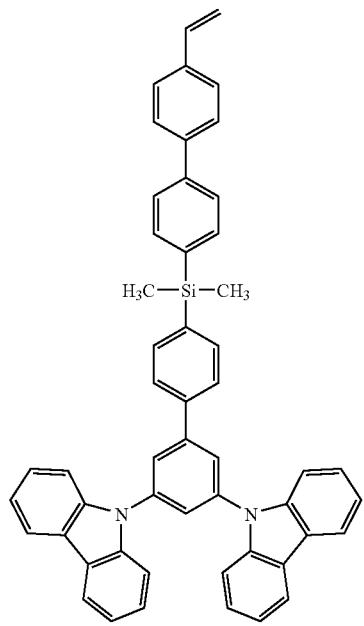
M-6
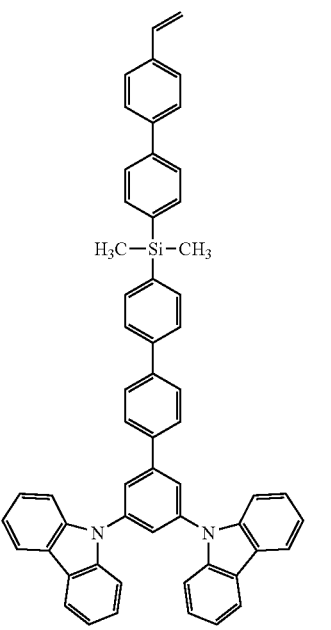
M-17
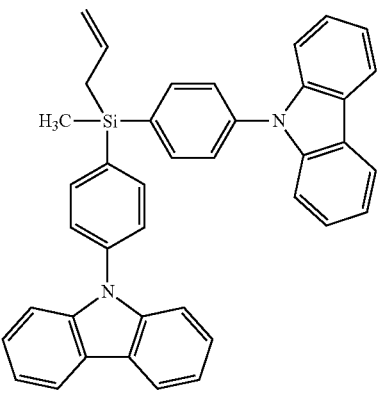

M-18
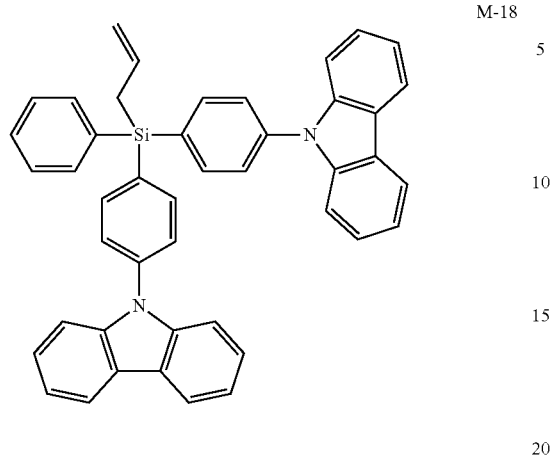
M-19
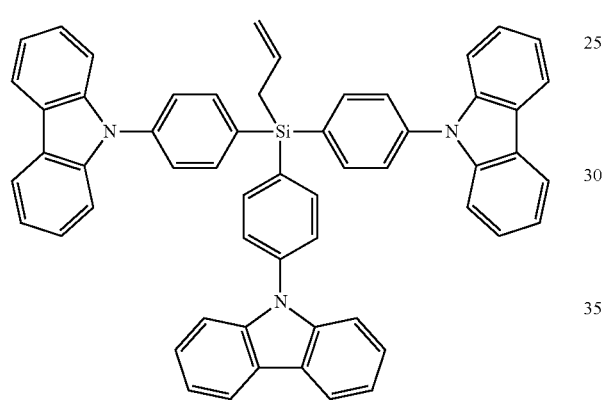
M-20
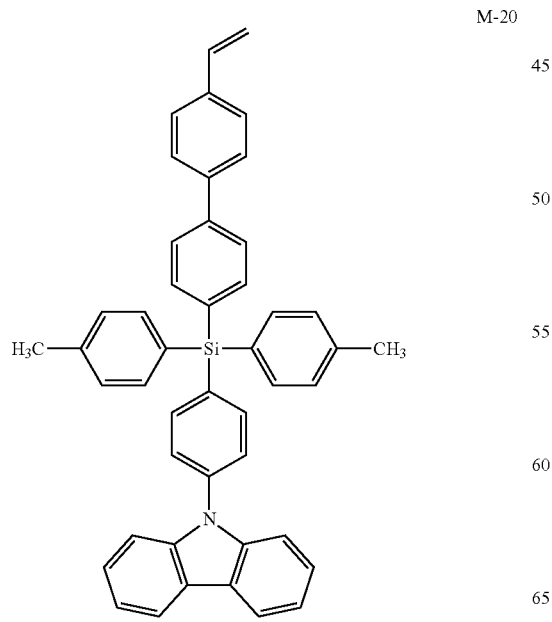
M-22
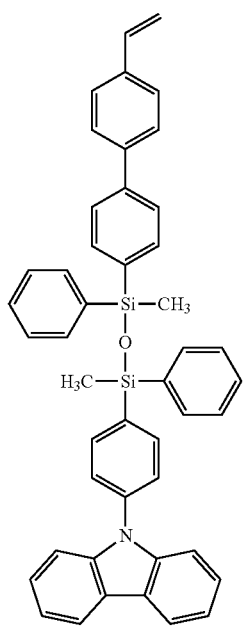
M-23
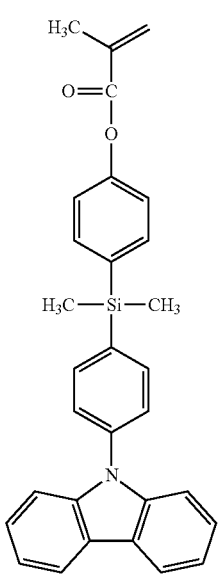

M-24
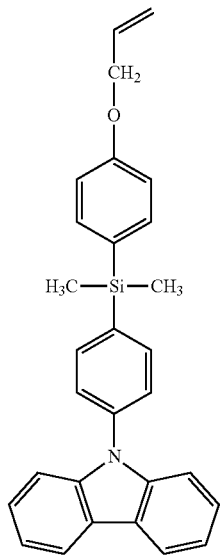
P-1
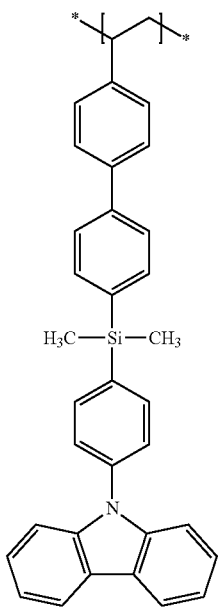
M-25
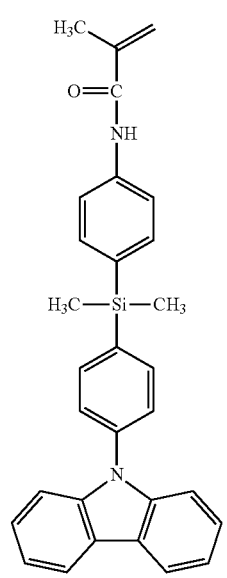
P-2
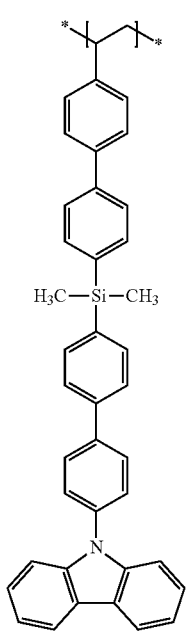
7. The polymer as claimed in claim 1 or 2, wherein the repeat unit represented by General Formula 2 is one of the repeat units P-1 to P-5, P-8, P-9, P-11, and P-13 to P-15:

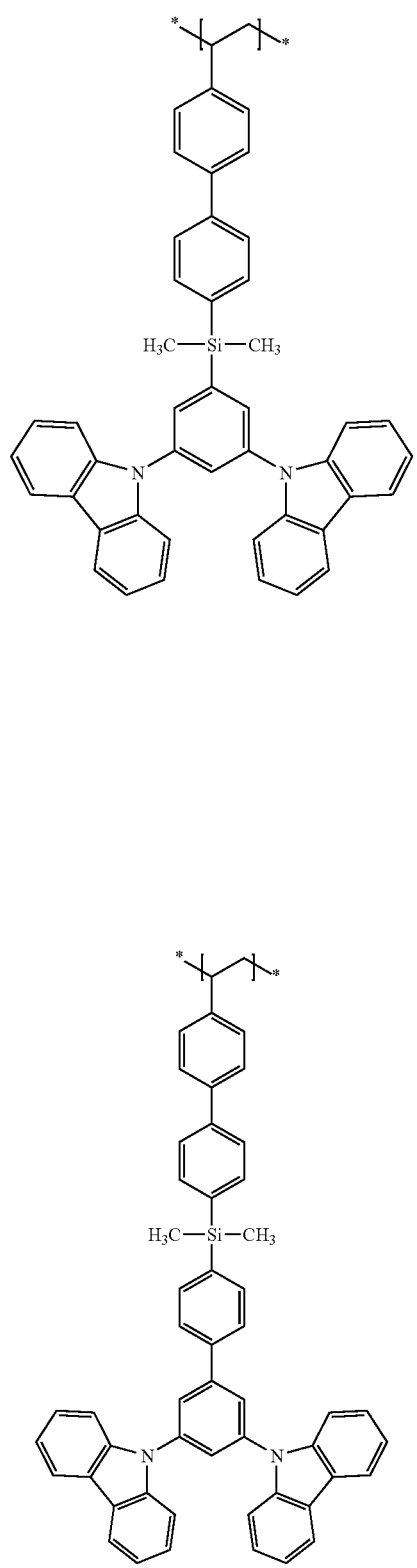
P-3
P-4
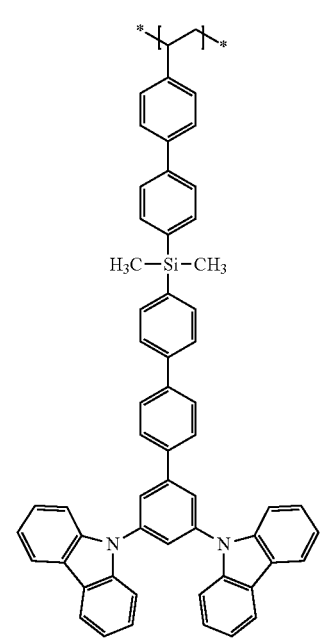
P-5
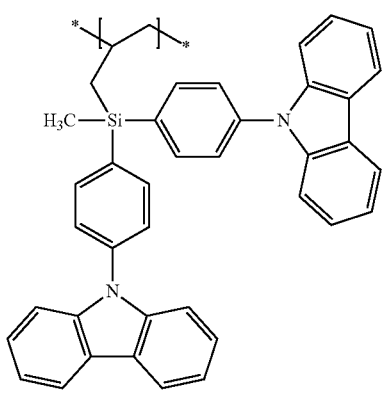
P-8
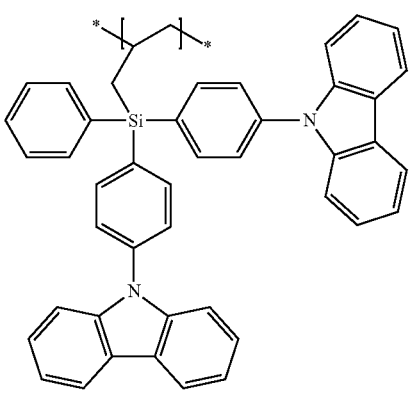
P-9

P-11
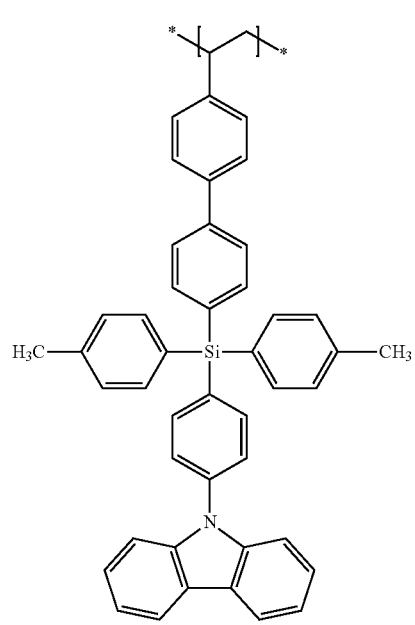
P-14
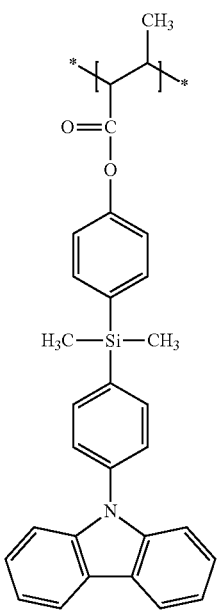
P-13
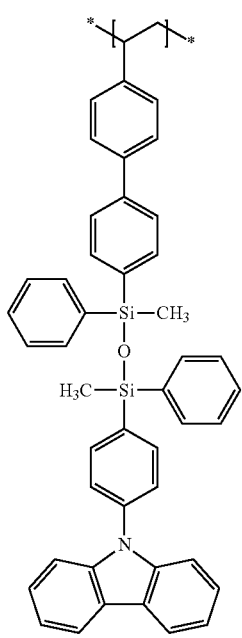
P-15
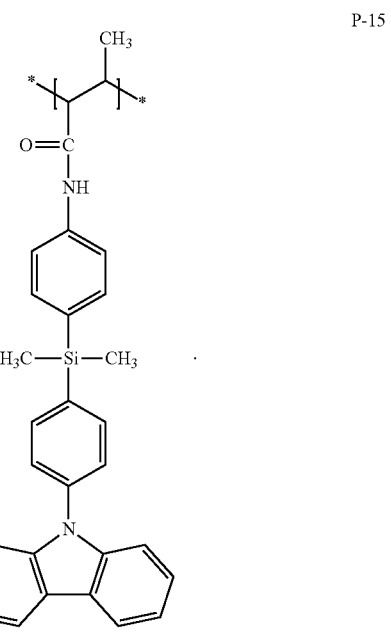
8. The polymer as claimed in claim 5, wherein the repeat unit represented by General Formula 2 is formed by polymerization of one of the monomers Q-1 to Q-6, and is represented by one of the repeat units X-1 to X-6:

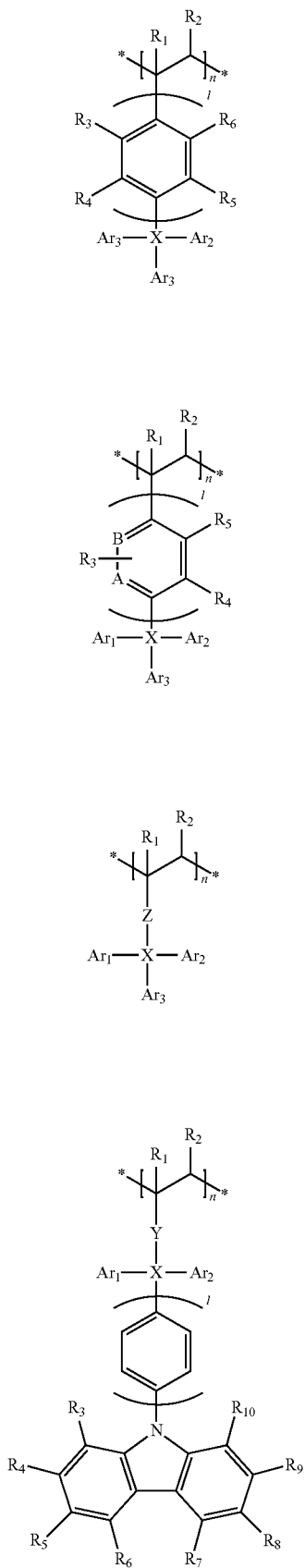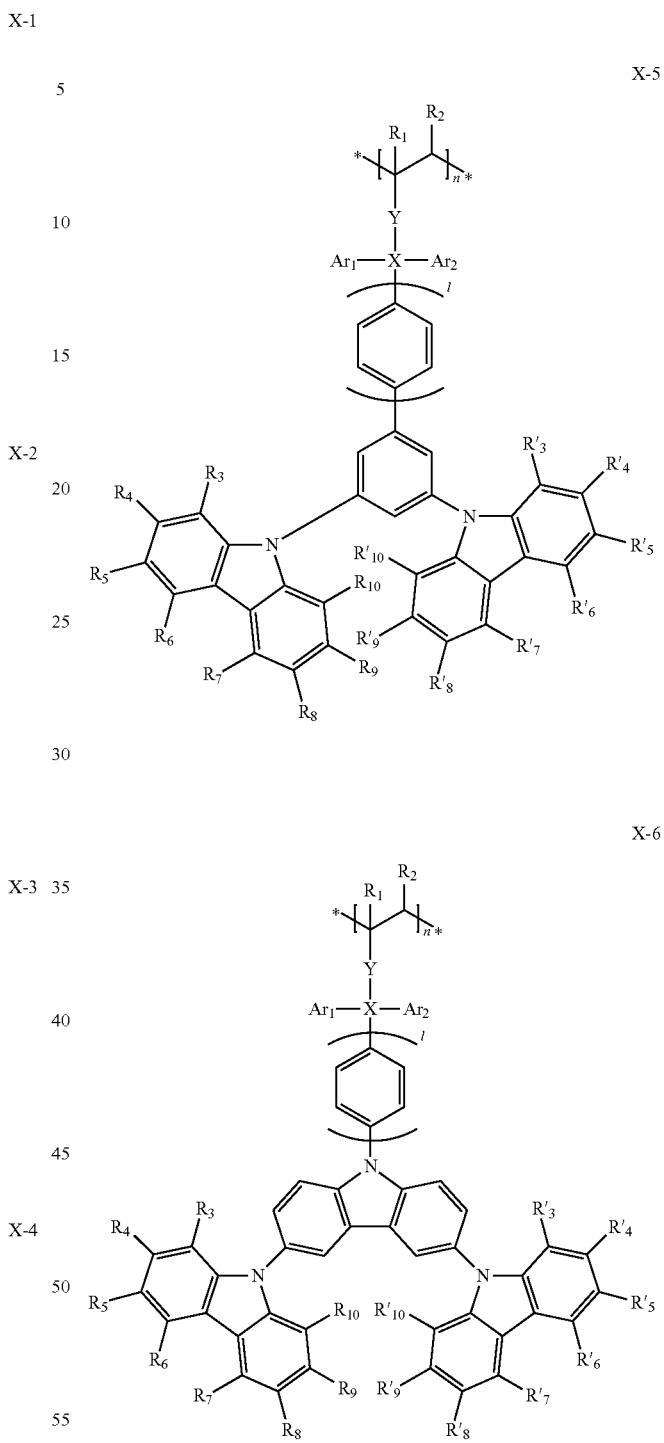
wherein in repeat units X-1 to X-6, X, Y, Z, A, B, $Ar_1$, $Ar_2$, $Ar_3$, $R_1$, $R_2$, $R_3$-$R_{10}$, $R_3'$-$R_{10}'$, M, and l each represents the same as in monomers Q-1 to Q-6, and n is an integer from 1 to 1,000,000.
9. The polymer as claimed in claim 2, wherein the monomer represented by General Formula 3 is one of the following monomers Y-1 to Y-9:

Y-1 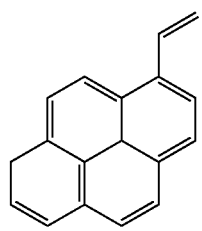
Y-2 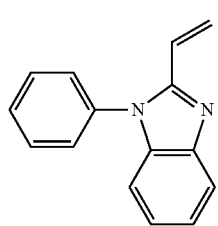
Y-3 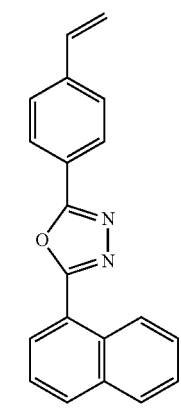
Y-4 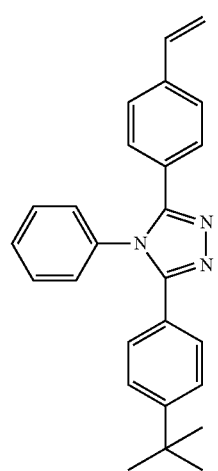
Y-5 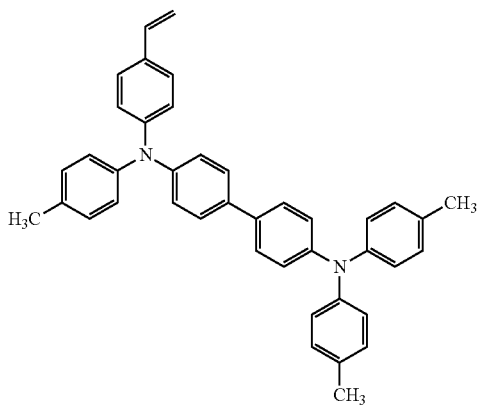
Y-6 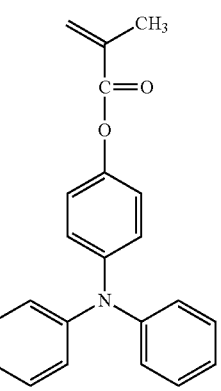
Y-7 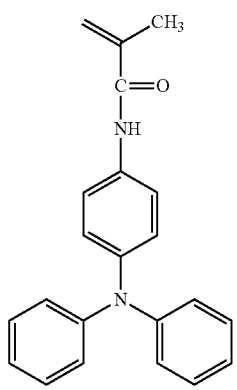
Y-8

10. The polymer as claimed in claim 2, wherein the repeat unit represented by General Formula 4 is one of the repeat units Z-1 to Z-9:

Z-8

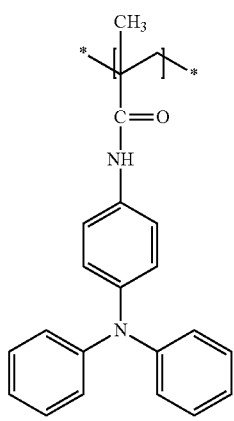

Z-9

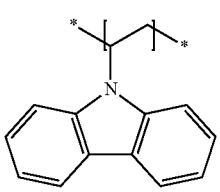

11. The polymer as claimed in claim 1 or 2, wherein the polymer has a weight average molecular weight of 1,000 to 5,000,000.

12. The polymer as claimed in claim 1 or 2, wherein the polymer has a number average molecular weight of 500 to 2,000,000.

13. An organic light emitting diode comprising a pair of electrodes, and an organic layer containing the polymer as claimed in claim 1 or 2.

14. The polymer as claimed in claim 1, wherein Y is a single bond.

15. The polymer as claimed in claim 1, wherein Y is a C7-C30 substituted or non-substituted arylene group.

16. The polymer as claimed in claim 14, wherein the monomer represented by General Formula 1 is one of the monomers M-7 to M-16 and M-21:

M-7

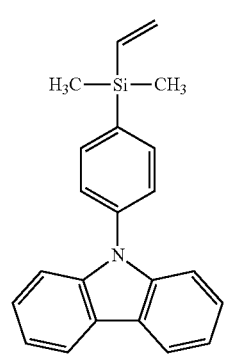

M-8

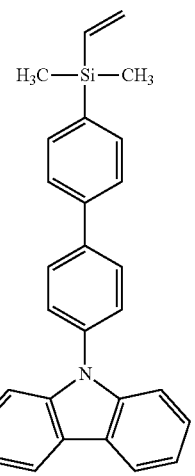

M-9

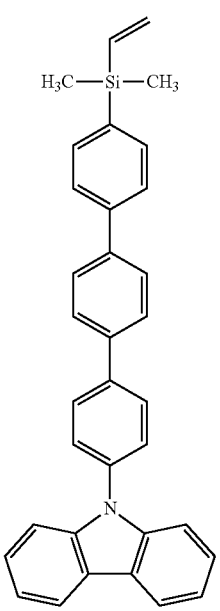

M-10

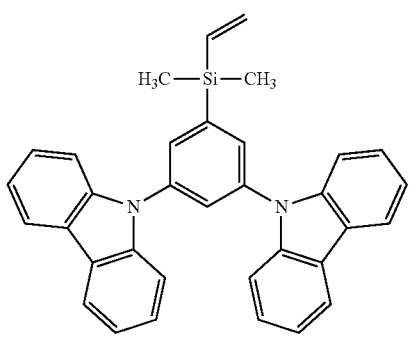

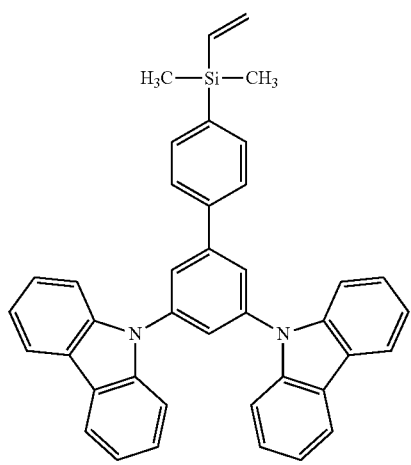
M-11
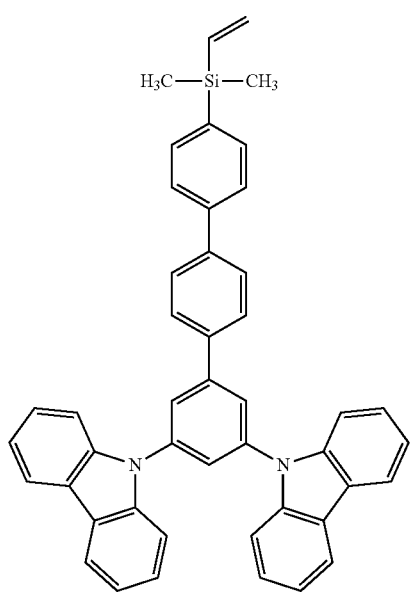
M-12
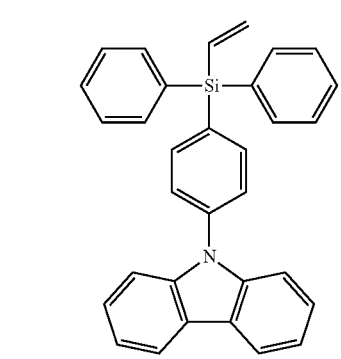
M-13
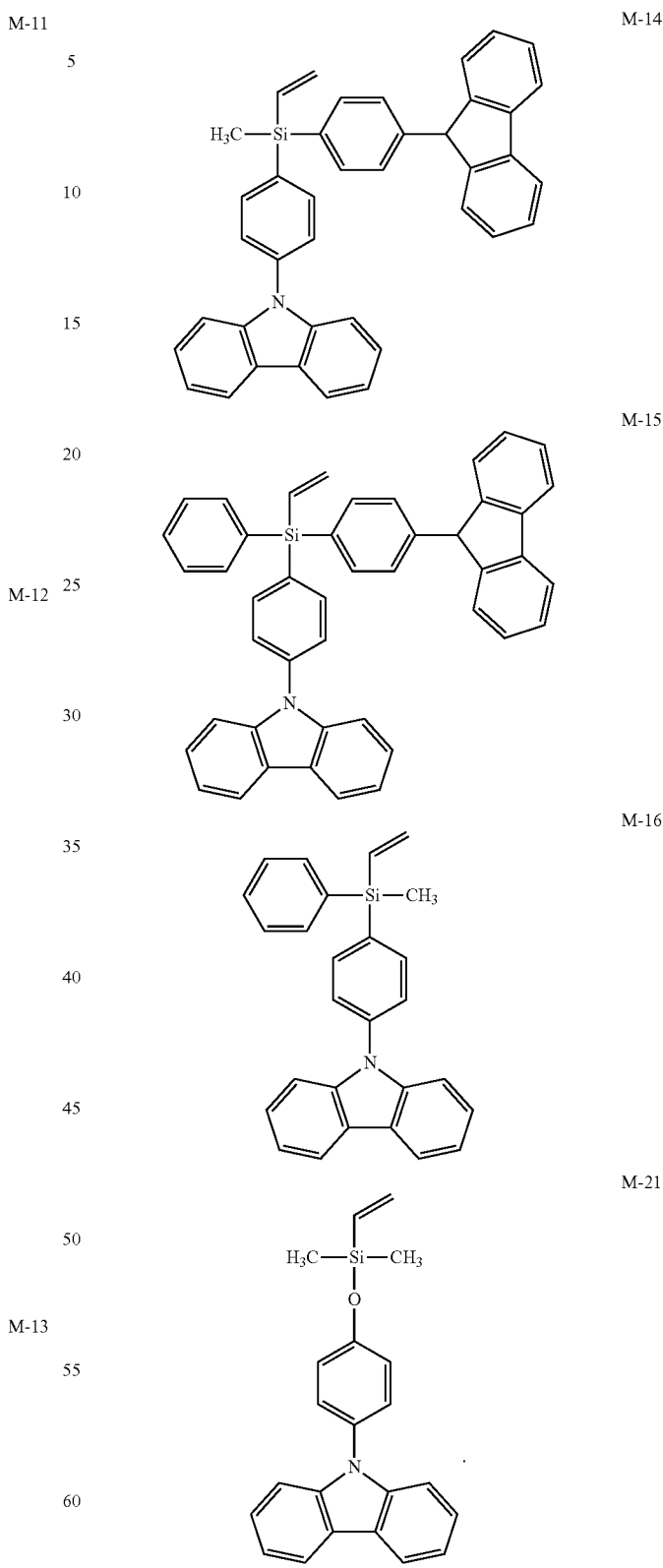
17. The polymer as claimed in claim 14, wherein the repeat unit represented by General Formula 2 is one of the repeat units P-6, P-7, P-10, and P-12:

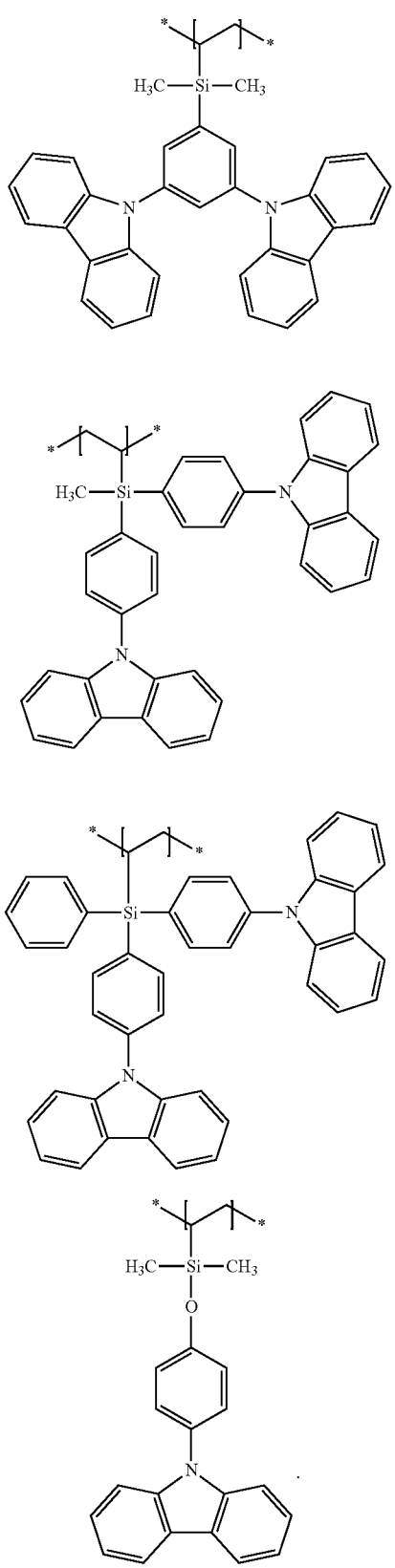
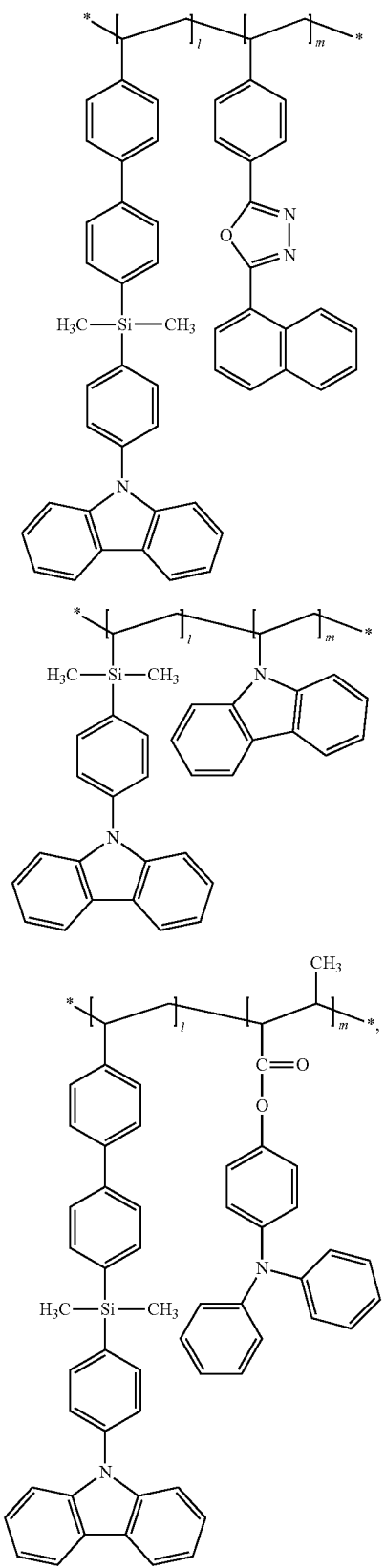
18. The polymer as claimed in 2, wherein the polymer includes one of the repeat units P-16 to P-18:
wherein in repeat units P-16 to P-18, l and m are each an integer from 1 to 1,000,000.
* * * * *